(12) United States Patent
Lee

(10) Patent No.: US 9,437,784 B2
(45) Date of Patent: Sep. 6, 2016

(54) LIGHT EMITTING DEVICE

(71) Applicant: LG INNOTEK CO., LTD., Seoul (KR)

(72) Inventor: Gun Kyo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 78 days.

(21) Appl. No.: 13/841,271

(22) Filed: Mar. 15, 2013

(65) Prior Publication Data

US 2014/0117389 A1 May 1, 2014

(30) Foreign Application Priority Data

Oct. 29, 2012 (KR) ........................ 10-2012-0120332

(51) Int. Cl.
| | |
|---|---|
| *H01L 33/38* | (2010.01) |
| *H01L 33/46* | (2010.01) |
| *H01L 33/44* | (2010.01) |
| *H01L 33/50* | (2010.01) |
| *H01L 33/62* | (2010.01) |
| *F21K 99/00* | (2016.01) |
| *F21Y 101/02* | (2006.01) |
| *F21V 29/77* | (2015.01) |
| *F21V 29/83* | (2015.01) |

(52) U.S. Cl.
CPC ............... *H01L 33/44* (2013.01); *F21K 9/13* (2013.01); *H01L 33/38* (2013.01); *H01L 33/505* (2013.01); *H01L 33/62* (2013.01); *F21V 29/77* (2015.01); *F21V 29/83* (2015.01); *F21Y 2101/02* (2013.01); *H01L 33/507* (2013.01); *H01L 2224/48091* (2013.01); *H01L 2924/12032* (2013.01)

(58) Field of Classification Search
CPC ... H01L 33/505; H01L 33/507; H01L 33/44; H01L 33/38; H01L 33/67; H01L 2224/48091; H01L 2923/12032; H01L 33/33; H01L 33/62

USPC ........................................................... 257/81
See application file for complete search history.

(56) References Cited

U.S. PATENT DOCUMENTS

| | | | | |
|---|---|---|---|---|
| 6,396,082 B1 | | 5/2002 | Fukasawa et al. | |
| 6,465,951 B1 | * | 10/2002 | Krafcik et al. | ............... 313/512 |
| 7,078,737 B2 | * | 7/2006 | Yuri | ........................ H01L 24/24 |
| | | | | 257/749 |
| RE41,234 E | * | 4/2010 | Takahashi | ............... C03C 3/045 |
| | | | | 252/301.4 F |
| 8,664,635 B2 | * | 3/2014 | Jung | ..................... H01L 33/505 |
| | | | | 257/13 |
| 8,987,772 B2 | * | 3/2015 | Kim | .................... H01L 33/0008 |
| | | | | 257/98 |
| 9,142,735 B2 | * | 9/2015 | Lee | ........................ H01L 33/505 |

(Continued)

FOREIGN PATENT DOCUMENTS

| | | |
|---|---|---|
| DE | 10 2010 045 403 A1 | 3/2012 |
| EP | 1 760 795 A2 | 3/2007 |

(Continued)

*Primary Examiner* — Matthew W Such
*Assistant Examiner* — Stephen C Smith
(74) *Attorney, Agent, or Firm* — Birch, Stewart, Kolasch & Birch, LLP

(57) ABSTRACT

Disclosed is a light emitting device including a light emitting structure comprising a first semiconductor layer, an active layer and a second semiconductor layer, a phosphor plate disposed on the second semiconductor layer, a first electrode portion disposed on the phosphor plate, and a plurality of bonding portions disposed between the light emitting structure and the phosphor plate, the bonding portions bonding the phosphor plate to the light emitting structure, wherein each bonding portion includes at least one first bonding portion electrically connected to the first electrode portion.

19 Claims, 19 Drawing Sheets

(56) References Cited

U.S. PATENT DOCUMENTS

| | | |
|---|---|---|
| 2004/0041159 A1 | 3/2004 | Yuri et al. |
| 2006/0157721 A1* | 7/2006 | Tran et al. ........................ 257/98 |
| 2008/0173884 A1* | 7/2008 | Chitnis ................... H01L 33/44 257/98 |
| 2009/0014731 A1* | 1/2009 | Andrews ............... H01L 33/508 257/79 |
| 2009/0140272 A1* | 6/2009 | Beeson et al. .................. 257/89 |
| 2010/0176751 A1* | 7/2010 | Oshio et al. .................. 315/362 |
| 2010/0295077 A1* | 11/2010 | Melman ................. H01L 33/50 257/98 |
| 2011/0163346 A1* | 7/2011 | Seo ......................... H01L 33/08 257/99 |
| 2011/0210345 A1* | 9/2011 | Lim ......................... H01L 33/20 257/88 |
| 2011/0248305 A1* | 10/2011 | Ling .................... H01L 33/505 257/98 |
| 2012/0018754 A1* | 1/2012 | Lowes ................... F21K 9/135 257/98 |
| 2012/0018764 A1* | 1/2012 | Choi et al. ...................... 257/99 |
| 2012/0018765 A1* | 1/2012 | Mizogami ............... H01L 33/42 257/99 |
| 2012/0043574 A1 | 2/2012 | Lee et al. |
| 2012/0080702 A1* | 4/2012 | Lin ................................. 257/98 |
| 2012/0080703 A1* | 4/2012 | Lin ................................. 257/98 |
| 2012/0119245 A1* | 5/2012 | Chen ....................... H01L 33/38 257/98 |
| 2012/0211775 A1* | 8/2012 | Hosoya et al. ................. 257/88 |
| 2012/0241797 A1* | 9/2012 | Kim et al. ...................... 257/98 |
| 2013/0234192 A1* | 9/2013 | Kim ................... H01L 33/0008 257/98 |
| 2013/0240834 A1* | 9/2013 | Tran ..................... H01L 33/505 257/13 |
| 2014/0048824 A1* | 2/2014 | Hsieh ..................... H01L 24/82 257/88 |

FOREIGN PATENT DOCUMENTS

| | | |
|---|---|---|
| EP | 2 437 321 A1 | 4/2012 |
| KR | 10-2011-0084774 A | 7/2011 |
| KR | 10-2012-0004876 A | 1/2012 |

* cited by examiner

LIGHT EMITTING DEVICE

CROSS REFERENCE TO RELATED APPLICATION

This application claims priority under 35 U.S.C. §119 to Korean Patent Application No. 10-2012-0120332, filed in Korea on Oct. 29, 2012, which is hereby incorporated in its entirety by reference as if fully set forth herein.

TECHNICAL FIELD

Embodiments relate to a light emitting device.

BACKGROUND

Light emitting devices such as light emitting diodes (LEDs) or laser diodes (LDs) using Group III-V or II-VI compound semiconductor materials render a variety of colors such as red, green, blue and ultraviolet rays in accordance with development of thin film growth methods and device materials. Light emitting devices efficiently realize white rays using fluorescent materials or combining colors, and have advantages such as low power consumption, semi-permanent lifespan, high response speed, stability and eco-friendliness, as compared to conventional light sources such as fluorescent lamps and incandescent lamps.

In general, a resin composition comprising a mixture of a phosphor and a resin is applied to light emitting chips, or the light emitting chips are sealed with a resin composition in order to produce white light. In addition, instead of a method of coating or molding a resin containing a phosphor, a method of disposing layers, sheets or plates containing phosphors on light emitting chips may be used. In this case, it is important to stably adhere phosphor layers, phosphor sheets or phosphor plates to upper parts of light emitting chips.

SUMMARY

Embodiments provide a light emitting device to improve adhesion accuracy of phosphor plates and prevent discoloration and cracks of the phosphor plates caused by heat.

In one embodiment, a light emitting device includes a light emitting structure comprising a first semiconductor layer, an active layer and a second semiconductor layer, a phosphor plate disposed on the second semiconductor layer, a first electrode portion disposed on the phosphor plate, and a plurality of bonding portions disposed between the light emitting structure and the phosphor plate, the bonding portions bonding the phosphor plate to the light emitting structure, wherein each bonding portion comprises at least one first bonding portion electrically connected to the first electrode portion.

The first electrode portion may include a pad portion disposed on an upper surface of the phosphor plate, and a connection portion for connecting the pad portion to the first bonding portion.

Each bonding portion may include at least one second bonding portion electrically isolated from the first electrode portion, wherein the second bonding portion includes a first bonding layer disposed in the phosphor plate, and a second bonding layer disposed on the light emitting structure and bonded to the first bonding layer.

The connection portion may pass through the phosphor plate.

The first bonding portion may include a first bonding electrode disposed on the second semiconductor layer, and a second bonding electrode disposed on a lower surface of the phosphor plate and on the connection portion, and bonded to the first bonding electrode.

The second bonding electrode may be fused to the first bonding electrode.

A fused interface may be present between the first bonding electrode and the second bonding electrode.

A melting point of the second bonding electrode may be different from a melting of the first bonding electrode.

The first electrode portion may further include an extension electrode disposed on the second semiconductor layer, wherein the first bonding portion comprises a third bonding electrode disposed between the connection portion and the extension electrode, and bonds the connection portion to the extension electrode.

A melting point of the third bonding electrode may be different from a melting point of the extension electrode.

The third bonding electrode may be fused to the extension electrode.

A fused interface may be present between the third bonding electrode and the extension electrode.

A width of one portion of the extension electrode bonded to the third bonding electrode may be different from a width of another portion of the extension electrode.

A width of the third bonding electrode may be smaller than or equivalent to a width of the extension electrode.

An air void (gap) may be present between the phosphor plate and the light emitting structure.

The first electrode portion may further include an extension electrode disposed on the second semiconductor layer, wherein the first bonding portion comprises a third bonding electrode being disposed between a lower surface of the phosphor plate and the extension electrode and bonding the phosphor plate to the extension electrode.

The first bonding portion may further include a bonding electrode being disposed between the connection portion and the extension electrode and bonding the connection portion to the extension electrode.

The first bonding electrode and the second bonding electrode may include at least one identical metal.

The pad portion may be disposed at a side of the phosphor plate.

In another embodiment, a light emitting device package includes a package body, a first lead frame and a second lead frame disposed on the package body, a light emitting device disposed on the second lead frame, and a resin layer surrounding the light emitting device, wherein the light emitting device includes a light emitting structure comprising a first semiconductor layer, an active layer and a second semiconductor layer, a phosphor plate disposed on the second semiconductor layer, a first electrode portion disposed on the phosphor plate, and a plurality of bonding portions disposed between the light emitting structure and the phosphor plate, the bonding portions bonding the phosphor plate to the light emitting structure, wherein each bonding portion comprises at least one first bonding portion electrically connected to the first electrode portion.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
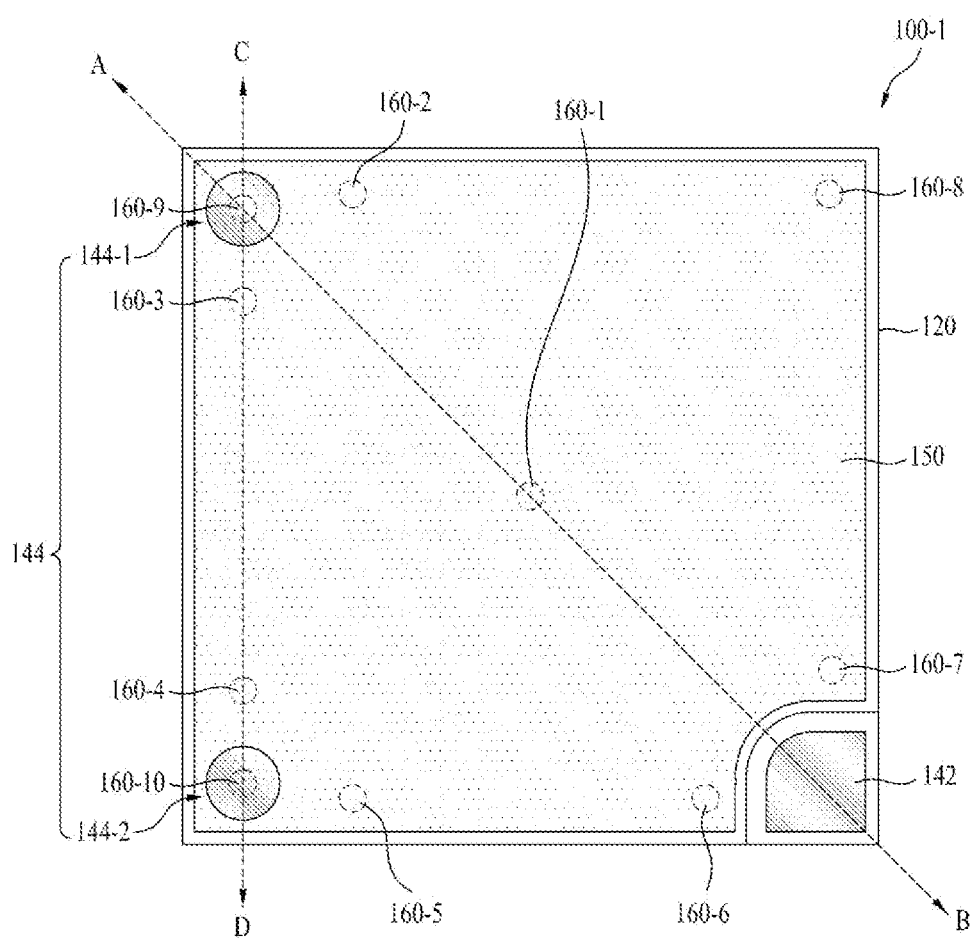
FIG. 1 is a plan view illustrating a light emitting device according to one embodiment.

Hereinafter, embodiments will be clearly understood from the description taken in conjunction with the annexed drawings and the embodiments.

Prior to description of the embodiments, with regard to description of preferred embodiments, it will be understood that, when one element such as a layer (film), a region or a structure is referred to as being formed "on" or "under" another element such as a substrate, a layer (film), a region, a pad or a pattern, the one element may be directly formed "on" or "under" the another element, or be indirectly formed "on" or "under" the another element via an intervening element present therebetween. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

Figure 2:
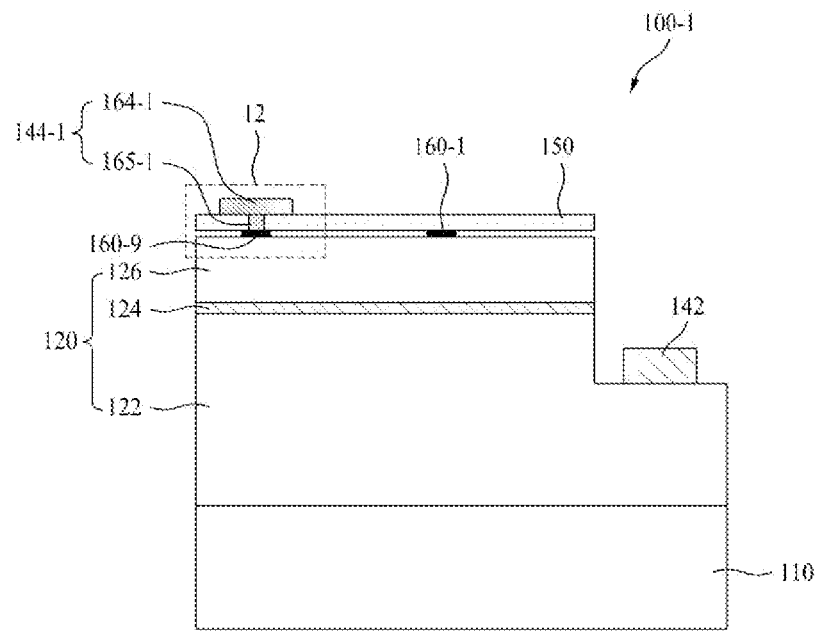
FIG. 2 is a sectional view taken along the direction AB of the light emitting device shown in FIG. 1.
Figure 3:
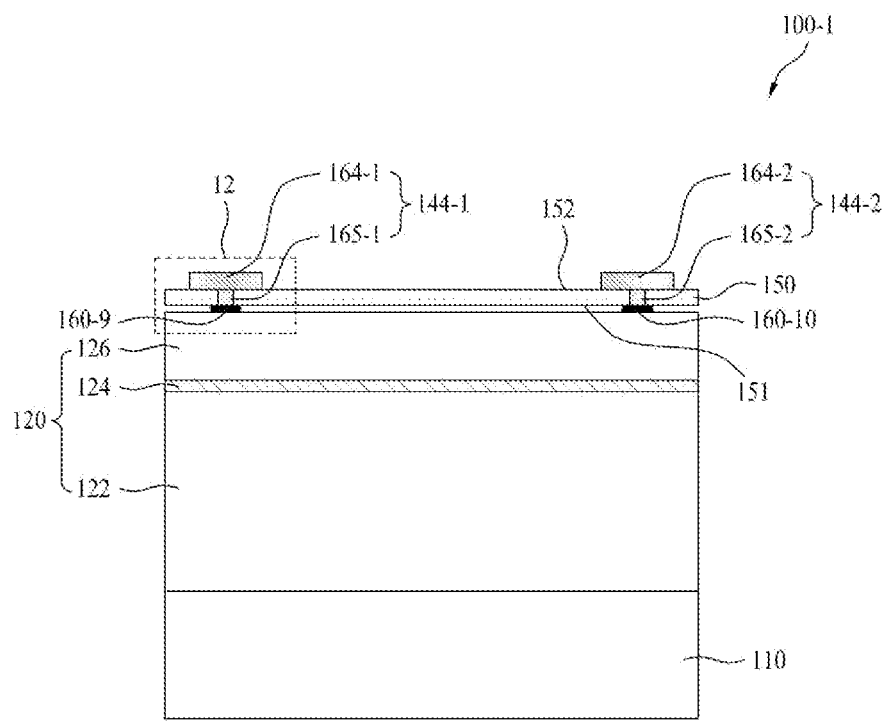
FIG. 3 is a sectional view taken along the direction CD of the light emitting device shown in FIG. 1.
Figure 4:
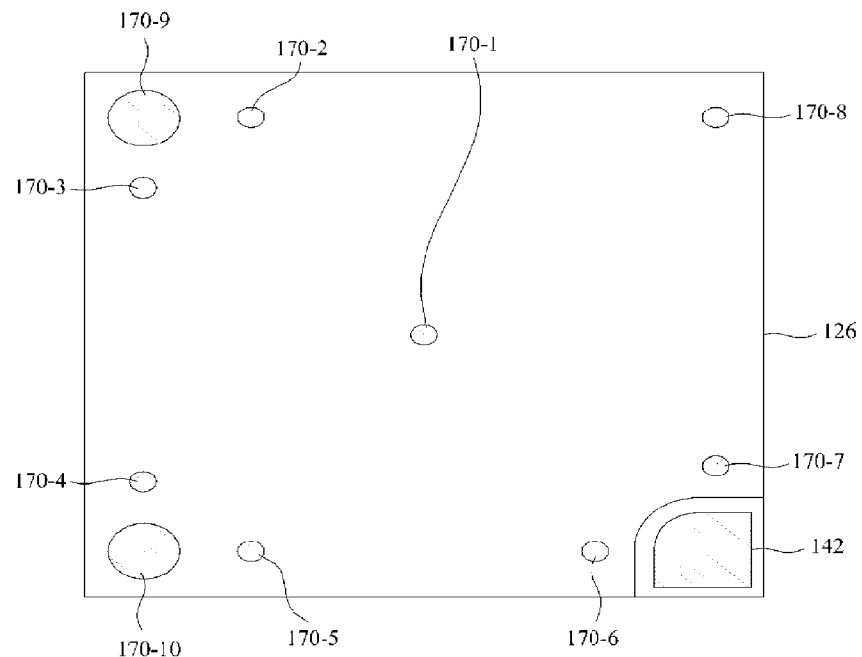
FIG. 4 illustrates an upper surface of a second semiconductor layer on which a first bonding electrode of a bonding portion shown in FIG. 1 are disposed.
Figure 5:
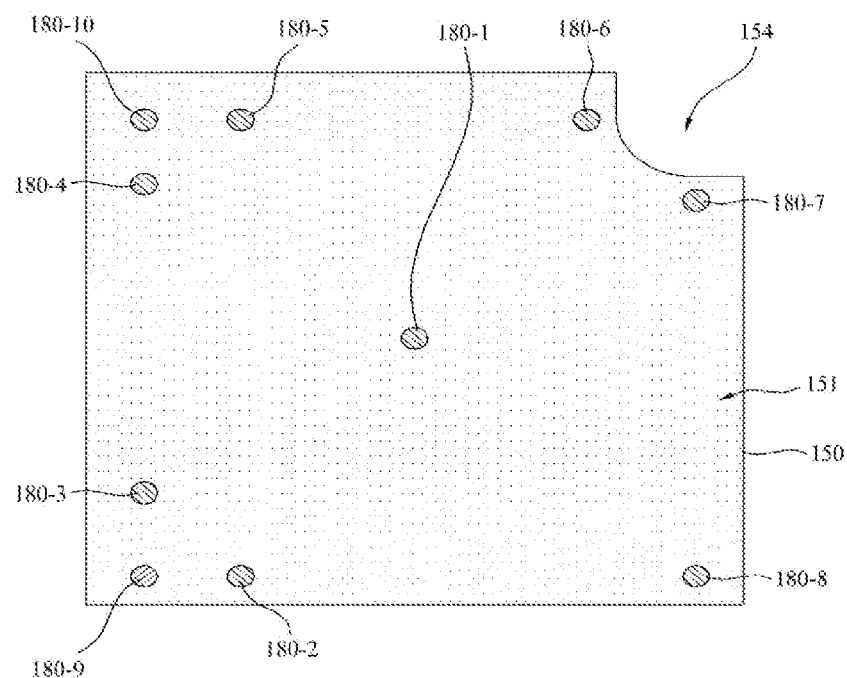
FIG. 5 illustrates a lower surface of a phosphor plate on which a second bonding electrode of the bonding portion shown in FIG. 1 is disposed.
Figure 6:
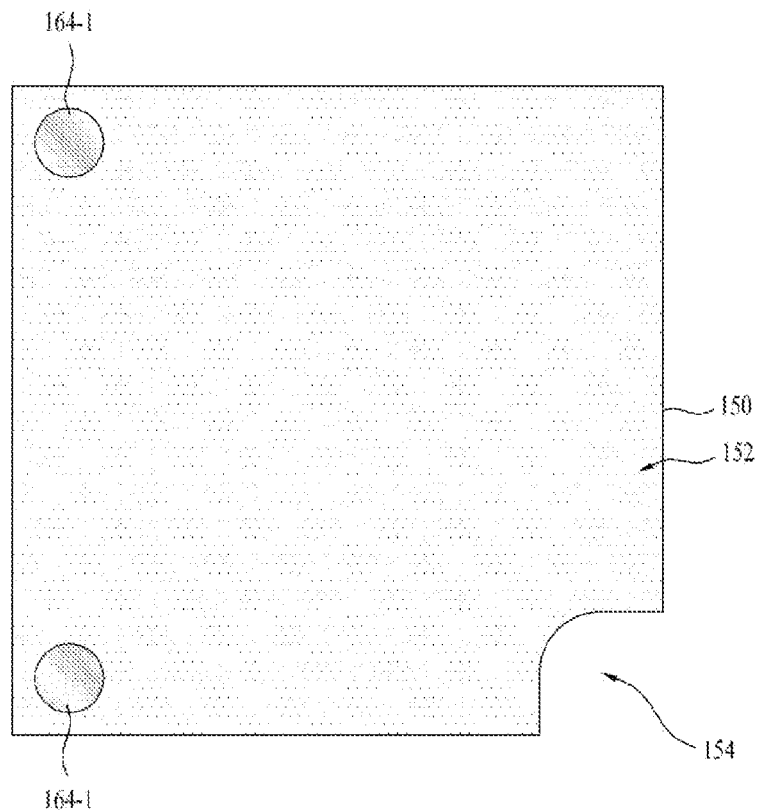
FIG. 6 illustrates an upper surface of the phosphor plate on which a second electrode is disposed.

FIG. 1 is a plan view illustrating a light emitting device 100-1 according to one embodiment. FIG. 2 is a sectional view taken along the direction AB of the light emitting device 100-1 shown in FIG. 1. FIG. 3 is a sectional view taken along the direction CD of the light emitting device 100-1 shown in FIG. 1. FIG. 4 illustrates an upper surface of a second semiconductor layer 126 on which first bonding electrodes 170-1 to 170-$n$ of bonding portions 160-1 to 160-$n$ shown in FIG. 1 are disposed. FIG. 5 illustrates a lower surface 151 of a phosphor plate 150 on which second bonding electrodes 180-1 to 180-$n$ of bonding portions 160-1 to 160-$n$ shown in FIG. 1 are disposed. FIG. 6 illustrates an upper surface 152 of the phosphor plate 150 on which second electrodes 144-1 and 144-2 are disposed.

Referring to FIGS. 1 to 6, the light emitting device 100-1 includes a substrate 110, a light emitting structure 120, a first electrode 142, a second electrode 144, a plurality of bonding portions 160-1 to 160-$n$ (in which n is a natural number higher than 1) and a phosphor plate 150.

The substrate 110 supports the light emitting structure 120. The substrate 110 may be formed of a material suitable for development of semiconductor materials. In addition, the substrate 110 may be formed of a material with high thermal conductivity and may be a conductive substrate or an insulating substrate.

For example, the substrate 110 may be sapphire ($Al_2O_3$) or a material including at least one of GaN, SiC, ZnO, Si, GaP, InP, $Ga_2O_3$ and GaAs. The substrate 110 may have roughness or unevenness on an upper surface to improve light extraction.

In order to reduce lattice mismatch caused by difference in lattice constant between the substrate 110 and the light emitting structure 120, a buffer layer (not shown) may be disposed between the first semiconductor layer 122 and the substrate 110. The buffer layer may be a nitride semiconductor including Group III and V elements.

For example, the buffer layer may include at least one of InAlGaN, GaN, AlN, AlGaN and InGaN. The buffer layer may have a single layer structure or a multi-layer structure and may be doped with a Group II element or Group IV element as an impurity.

In addition, in order to improve crystallinity of the first semiconductor layer 122, an undoped semiconductor layer (not shown) may be interposed between the substrate 110 and the light emitting structure 120. For example, the undoped semiconductor layer has the same properties as the first semiconductor layer, except that the undoped semiconductor layer has a low electrical conductivity, as compared to the first semiconductor layer 122, since the undoped semiconductor layer is not doped with a first type conductive dopant such as an n- or p-type dopant.

The light emitting structure 120 is disposed on the substrate 110 and emits light. The light emitting structure 120 may expose a part of the first semiconductor layer 122. For example, the part of the first semiconductor layer 122 may be exposed by partially etching the second semiconductor layer 126, the active layer 124 and the first semiconductor layer 122.

The first semiconductor layer 122 may be disposed on the substrate 110 and may be a nitride semiconductor layer.

For example, the first semiconductor layer 122 may be selected from semiconductor materials having a compositional formula of $In_xAl_yGa_{(1-x-y)}N$ ($0 \le x \le 1$, $0 \le y \le 1$, $0 \le x+y \le 1$), such as GaN, AlN, AlGaN, InGaN, InN, InAlGaN and AlInN, and may be doped with an n-type dopant such as Si, Ge, Sn, Se or Te.

The active layer 124 may be disposed between the first semiconductor layer 122 and the second semiconductor layer 126. The active layer 124 generates light based on energy generated in the process of recombination of electrons supplied from the first semiconductor layer 122 and holes supplied from the second semiconductor layer 126.

The active layer 124 may be a semiconductor having a compositional formula of $In_xAl_yGa_{1-x-y}N$ ($0 \le x \le 1$, $0 \le y \le 1$, $0 \le x+y \le 1$) and the active layer 124 may have a quantum well structure including at least one quantum well layer and at least one quantum barrier layer which alternate with each other. For example, the active layer 124 may have a multi quantum well (MQW) structure. An energy band gap of the quantum barrier layer may be greater than that of the quantum well layer.

The second semiconductor layer 126 may be disposed on the active layer 124 and may be a nitride semiconductor layer. The second semiconductor layer 126 may be selected from semiconductor materials having a compositional formula of $In_xAl_yGa_{1-x-y}N$ ($0 \le x \le 1$, $0 \le y \le 1$, $0 \le x+y \le 1$), for example, GaN, AlN, AlGaN, InGaN, InN, InAlGaN and AlInN, and may be doped with a p-type dopant such as Mg, Zn, Ca, Sr or Ba.

A part of the first semiconductor layer 122 may be exposed. For example, a part of the first semiconductor layer 122 may be exposed by removing a part of the light emitting structure.

For example, the first electrode 142 may be deposited on the first semiconductor layer 122. The first electrode 142 may be a pad to which a wire to supply first power is bonded.

The second electrode 144 may be disposed on a surface 152 (for example, upper surface) of the phosphor plate 150. A portion of the second electrode 144 passes through the phosphor plate 150 and is exposed to another surface 151 (for example, lower surface) of the phosphor plate 150. The second electrode 144 may include a plurality of second electrodes. For example, the plurality of second electrodes 144-1 and 144-2 may be spaced from each other on the surface of the phosphor plate 150.

The phosphor plate 150 may have a through hole (see FIG. 9), and the second electrodes 144-1 and 144-2 may be formed by depositing a conductive material in the upper surface 152 of the phosphor plate 150 and the through hole 162.

The second electrode 144 is disposed on the upper surface 152 of the phosphor plate 150 and at least one pad portion 164-1 and 164-2 to which a wire 103 (see FIG. 9) to receive power from an external power source is bonded, and connection portions 165-1 and 165-2 which pass through the phosphor plate 150 and contact lower surfaces of the pad portions 164-1 and 164-2.

For example, the second electrode 144 may include a plurality of pad portions (for example, 164-1 and 164-2) which are spaced from one another on the upper surface of the phosphor plate 150, and connection portions (for example, 165-1 and 165-2) which are connected to the pad portions (for example, 164-1 and 164-2) and pass through the phosphor plate 150. That is, one end of the connection portion (for example, 165-1) contacts a lower surface of the pad portion (for example, 164-1) and the other end thereof is exposed from the lower surface 151 of the phosphor plate 150.

The first electrode 142 and the second electrode 144 may include a conductive material, for example, at least one of Pb, Sn, Au, Ge, Bi, Cd, Zn, Ag, Ni, Ti, Cu, Al, Ir, In, Mg, Pt or Pd, or an alloy containing the same, and have a single or multiple layer structure.

The phosphor plate 150 may be disposed on the light emitting structure 120, for example, on the second semiconductor layer 126. The phosphor plate 150 transforms a wavelength of light emitted from the light emitting structure 120.

The phosphor plate 150 may be a mixture of a phosphor and a resin. The resin mixed with the phosphor may be a transparent thermosetting resin having a high hardness and superior reliability and examples thereof include a silicone resin, an epoxy resin, glass, glass ceramic, a polyester resin, an acrylic resin, an urethane resin, a nylon resin, a polyamide resin, a polyimide resin, a vinyl chloride resin, a polycarbonate resin, a polyethylene resin, a Teflon resin, a polystyrene resin, a polypropylene resin, a polyolefin resin and the like. Preferably, the phosphor plate 150 is polycarbonate, glass or glass ceramic.

The phosphor mixed with the resin may include one or more types of phosphors. The phosphor plate 150 may include at least one of a silicate phosphor, a YAG phosphor and a nitride phosphor. For example, the silicate phosphor may be $Ca_2SiO_4:Eu$, $Sr_2SiO_4:Eu$, $Sr_3SiO_5:Eu$, $Ba_2SiO_4:Eu$, or $(Ca,Sr,Ba)_2SiO_4:Eu)$, the YAG phosphor may be $Y_3Al_5O_{12}:Ce$, $(Y,Gd)_3Al_5O_{12}:Ce)$, and the nitride phosphor may be $Ca_2Si_5N_8:Eu$, $CaAlSiN_2:Eu$, $(Sr,Ca)AlSiN_2:Eu$, or $\alpha,\beta$-SiAlON:Eu.

The phosphor plate may be manufactured by press-molding the mixture of the resin and the phosphor in the form of a slurry using a mold, but the disclosure is not limited thereto. The formation of the phosphor plate may be carried out by a method of extruding the mixture of the resin and the phosphor in the form of a slurry from an extruder, a so-called "extrusion molding". Alternatively, the formation of the phosphor plate may be carried out by a method in which the mixture of the resin and the phosphor is poured on the bottom and a blade designed to be spaced from the bottom by a predetermined distance is passed over the mixture, a so-called "doctor blade method".

The preliminary phosphor plate thus manufactured may be cut to a desired size and shape by a sawing or scribing process to form the phosphor plate 150.

The phosphor plate 150 may have at least one through hole 162 (see FIG. 9) exposing connection portions 165-1 and 165-2 of the second electrode 144.

In addition, the shape of the phosphor plate 150 may depend on the shape of the light emitting structure 120. For example, in order to expose the first electrode 142, the light emitting structure 120 may have removed portions and the phosphor plate 150 may have an exposure portion 154 which corresponds to the shape of one portion of the light emitting structure 120 exposing the first electrode 142.

The shape and number of the exposure portion 154 depend on the position, shape and number of the first electrode 142. For example, as shown in FIG. 5, the exposure portion 154 may have a shape formed by cutting an edge of the phosphor plate 150, but the disclosure is not limited thereto.

The bonding portions 160-1 to 160-*n* (in which n is a natural number higher than 1) may be disposed between the phosphor plate 150 and the light emitting structure 120, for example, the second semiconductor layer 126, and adhere or fix the phosphor plate 150 to the second semiconductor layer 126.

The bonding portions 160-1 to 160-*n* (in which n is a natural number higher than 1) may include at least one first bonding portion (for example, 160-9 or 160-10) and at least one second bonding portion (for example, 160-1 to 160-8).

The first bonding portion (for example, 160-9 or 160-10) may be electrically connected to the second electrode 144 and the second bonding portion (for example, 160-1 to 160-8) may be electrically isolated from the second electrode 144.

The first bonding portion (for example, 160-9 or 160-10) may be disposed between a portion of the second electrode 144 passing through the phosphor plate 150 and the second semiconductor layer 126, and adhere or fix the second electrode 144 to the second semiconductor layer 126, or electrically connect the second electrode 144 to the second semiconductor layer 126. The first bonding portion (for example, 160-9 to 160-10) may include one or more first bonding portions and the first bonding portions may be spaced from one another.

The first bonding portion (for example, 160-9 or 160-10) connected to the second electrode 144, among the bonding portions 160-1 to 160-*n* (n is a natural number of 1 or more), may function as an electrode supplying power to the light emitting structure 120.

The first bonding portion (for example, 160-9 to 160-10) includes at least one first bonding electrode (for example, 170-9 to 170-10) disposed on the second semiconductor layer 126, and at least one second bonding electrode (for example, 180-9 and 180-10) which is disposed on another surface (for example, lower surface 151) of the phosphor plate 150 and is bonded to the first bonding electrode (for example, 170-9 and 170-9).

In addition, the second bonding portion (for example, 160-1 to 160-8) may include at least one first bonding layer (170-1 to 170-8) disposed on the second semiconductor layer 126, and at least one second bonding layer (180-1 to 180-8) which is disposed on the lower surface 151 of the phosphor plate 150 and is bonded to the first bonding layer (for example, 170-1 to 170-8).

Referring to FIG. 4, the first bonding electrode (for example, 170-9, 170-10) may include a plurality of first bonding electrodes and the plurality of first bonding electrodes (for example, 170-9 and 170-10) may be spaced from one another on the second semiconductor layer 126. Also, the first bonding electrode (for example, 170-9 and 170-10) may be spaced from the first bonding layer (for example, 170-1 to 170-8).

The first bonding layer (for example, 170-1 to 170-8) may include a plurality of first bonding electrodes and the plurality of first bonding layers (for example, 170-1 to 170-8) may be spaced from one another on the second semiconductor layer 126. Also, the first bonding layers (for example, 170-1 to 170-8) may be spaced from the first bonding electrode (for example, 170-9 or 170-10).

For example, the first bonding electrode (for example, 170-9 to 170-10) and the first bonding layer (for example, 170-1 to 170-8) may be simultaneously formed by depositing a metal material on the second semiconductor layer 126 and patterning the deposited metal material by photolithography and etching processes.

Referring to FIG. 5, the second bonding electrode (for example, 180-9 or 180-10) may include a plurality of second bonding electrodes and the plurality of second bonding electrodes (for example, 180-9 and 180-10) may be spaced from one another on the lower surface 151 of the phosphor plate 150. The lower surface 151 of the phosphor plate 150 may face the upper surface 152 of the second semiconductor layer 126.

The second bonding layer (for example, 180-1 to 180-8) may include a plurality of second bonding layers and the plurality of second bonding layers (for example, 180-1 to 180-8) may be spaced from one another on the lower surface 151 of the phosphor plate 150. The second bonding layers (for example, 180-1 to 180-8) may be spaced from the second bonding electrode (for example, 180-9 or 180-10).

For example, the second bonding electrode (180-9, 180-10) and the second bonding layer (for example, 180-1 to 180-8) may be simultaneously formed by depositing a metal material on the lower surface of the phosphor plate 150 and patterning the deposited metal material by photolithography and etching processes.

The first bonding electrode 170-9 or 170-10 may contact the connection portion (for example, 165-1 or 165-2) exposed to the lower surface 151 of the phosphor plate 150. For example, the first bonding electrode (for example, 170-9) may contact the first connection portion (for example, 165-1) and the first bonding electrode (for example, 170-10) may contact the second connection portion (for example, 165-2).

Horizontal cross-sections of the first bonding electrodes 170-9 and 170-10 and the second bonding electrodes 180-9 and 180-10 and horizontal cross-sections of the first bonding layer 170-1 to 170-8 and the second bonding layers 180-1 to 180-8 may have a variety of shapes such as circular, oval or polygonal shapes.

In order to effectively adhere or fix the phosphor plate 150 to the second semiconductor layer 126, the first bonding electrodes (for example, 170-9 and 170-10) and the first bonding layers 170-1 to 170-8 may be disposed near edges and corners of the second semiconductor layer 126. The second bonding electrode (for example, 180-9 or 180-10) is disposed on the lower surface 151 of the phosphor plate 150 such that it corresponds to the first bonding electrode (for example, 170-9 or 170-10), and the second bonding layer (for example, 180-1 to 180-8) is disposed on the lower surface 151 of the phosphor plate 150 such that it corresponds to the first bonding layer (for example, 170-1 to 170-8). For example, the second bonding electrode (for example, 180-9 or 180-10) and the second bonding layer (for example, 180-1 to 180-8) are disposed near edges and corners of the phosphor plate 150.

One of the second bonding electrodes (for example, 180-9 and 180-10) may be bonded to the corresponding one of the first bonding electrodes (for example, 170-8 and 170-9). In addition, one of the second bonding layers (for example, 180-1 to 180-8) may be bonded to the corresponding one of the first bonding layers (for example, 170-1 to 170-8).

The first bonding electrode (for example, 170-9 or 170-10) and the second bonding electrode (for example, 180-9 or 180-10) which are bonded to each other may constitute the first bonding portion (for example, 160-9 or 160-10), and the first bonding layer (for example, 170-1 to 170-8) and the second bonding layer (for example, 180-1 to 180-8) which are bonded to each other may constitute the second bonding portion (for example, 160-1 to 160-8).

For example, the bonding between the first bonding electrode (for example, 170-9, 170-10) and the second bonding electrode (for example, 180-9 or 180-10) and the bonding between the bonding layer (for example, 170-1 to 170-8) and the second bonding layer (for example, 160-1 to 160-8) may be eutectic bonding.

The shape or width of the first bonding electrode (for example, 170-9 or 170-10) may be different from that of the bonding layer (for example, 170-1 to 170-8).

For example, the width or area of the first bonding electrode (for example, 170-9 or 170-10) may be greater than or equivalent to that of the bonding layer (for example, 170-1 to 170-8). The width (or area) of the first bonding electrode (for example, 170-9 and 170-10) may be greater than or equivalent to that of the first bonding layer (for example, 170-1 to 170-8) simply used only for bonding, since the first bonding electrode is directly connected to the second electrode 144 receiving power and directly receives a current. This enables the electrodes to be protected from damage caused by current concentration and improves current distribution.

Figure 7:
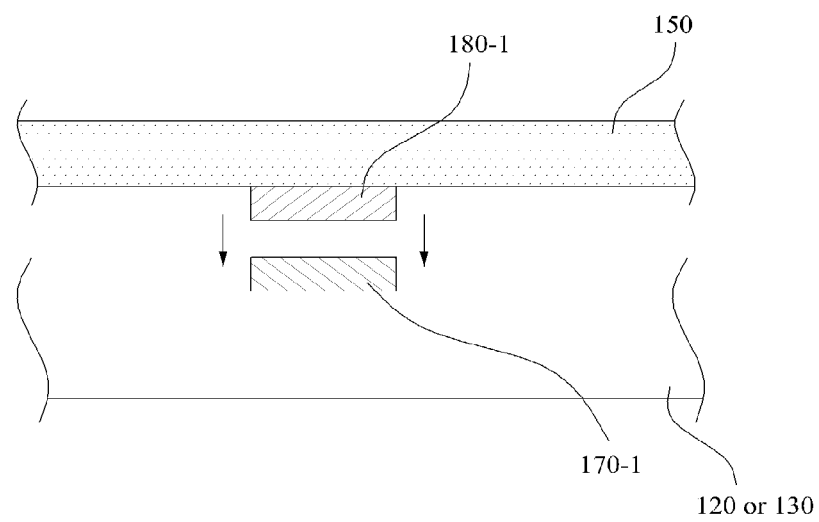
FIG. 7 illustrates fusing of the first bonding layer to the second bonding layer.
Figure 8:
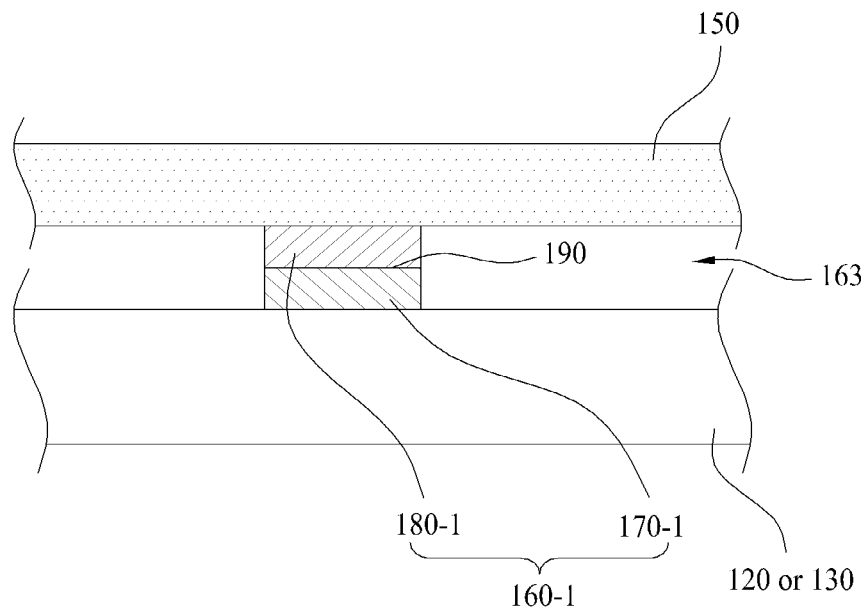
FIG. 8 illustrates the second bonding layer fused to the first bonding layer.

FIG. 7 illustrates fusing of the first bonding layer to the second bonding layer and FIG. 8 illustrates the second bonding layer fused to the first bonding layer.

Referring to FIGS. 7 and 8, the first bonding layer (for example, 170-1) and the second bonding layer (for example, 180-1) may be bonded to each other, and a fused interface 190 may be present between the first bonding layer (for example, 170-1) and the second bonding layer (for example, 180-1).

The first bonding layer 170-1 to 170-8 and the first bonding electrode (for example, 170-9 to 170-10) may include a metal material, for example, at least one of Ag, Ni, Cr, Ti, Al, Rh, Pd, Sn, Ru, Mg, Zn, Pt, and Au, or an alloy containing the same.

The second bonding layer (for example, 180-1 to 180-8) and the second bonding electrode (for example, 180-9 to 180-10) may include a metal material, for example, at least one of Ag, Ni, Cr, Ti, Al, Rh, Pd, Sn, Ru, Mg, Zn, Pt and Au, or an alloy containing the same.

Melting points of the second bonding layer 180-1 to 180-8 and the second bonding electrode (for example 180-9 to 180-10) may be lower than those of the first bonding layer 170-1 to 170-8 and the first bonding electrode (for example, 170-9 to 170-10).

For example, the first bonding layers (for example 170-1 to 170-8) and the first bonding electrodes 170-9 to 170-10 may be Au, and the second bonding layers 180-1 to 180-8 and the second bonding electrodes 180-9 to 180-10 may be AuSn.

The second bonding electrode (for example, 180-9 and 180-10) is melted and fused to the first bonding electrode (for example, 170-9 to 170-10) and the second bonding layer (for example, 180-1 and 180-8) is melted and fused to the first bonding layer (for example, 180-9 to 180-10).

In general, when the phosphor plate is adhered to the light emitting structure or the conductive layer using an adhesive such as silicone resin, the adhesive such as silicone resin is vulnerable to high temperatures, thus deteriorating reliability, a separate process (hereinafter, referred to as a "pad exposure process") to expose a pad portion bonded to the wire is required, and adhesion accuracy is deteriorated due to flowability of an adhesive resin.

However, in the present embodiment, as the phosphor plate 150 is adhered to the light emitting structure 120 by metal fusion, reliability is improved due to resistance to high temperatures, and adhesion accuracy is improved due to possibility of accurate bonding at an intended position.

Figure 9:
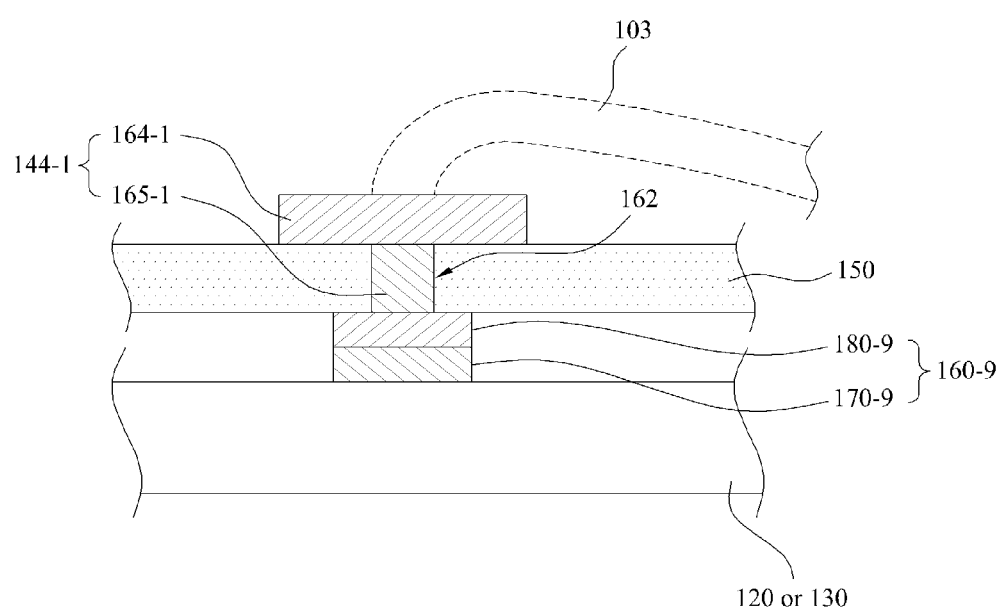
FIG. 9 is an enlarged view illustrating a dotted region shown in FIGS. 2 and 3.

In addition, the lower surface 151 of the phosphor plate 150 contacts the surface of the second semiconductor layer 126, as shown in FIGS. 2 and 3, but the disclosure is not limited thereto. As shown in FIGS. 8 and 9, at least one portion of the lower surface 151 of the phosphor plate 150 may be spaced from the surface of the second semiconductor layer 126 by the first bonding portions 160-9 to 160-10 and the second bonding portions 160-1 to 160-8.

An air gap (void) 163 may be present between the phosphor plate 150 and the second semiconductor layer 126 by the bonding portion 160-1 to 160-10. Although the air gap 163 is present, one portion of the lower surface 151 of the phosphor plate 150 may contact the second semiconductor layer 126.

A difference in index of refraction may be present between the second semiconductor layer 126, the air gap 163, and the phosphor plate 150. For this reason, light diffusion and extraction of the light emitting device 100-1 can be improved.

FIG. 9 is an enlarged view illustrating a dotted region 12 shown in FIGS. 2 and 3. Referring to FIG. 9, the phosphor plate 150 may have a through hole (for example, 162) and connection portions (165-1 and 165-2) may be formed by filling the through hole (for example, 162) with a conductive material. The conductive material for the connection portions 165-1 and 165-2 may be the same as the conductive material for the second electrode 144.

One end of the first connection portion 165-1 may contact a lower surface of the first pad portion 164-1 and the other end thereof may contact an upper surface of the second bonding electrode (for example, 180-9) of the first bonding portion 160-9. In addition, one end of the second connection portion 165-2 may contact a lower surface of the second pad portion 164-2 and the other end thereof may contact an upper surface of the second bonding electrode 180-10 of the first bonding portion 160-10.

For example, the first connection portion 165-1 passes through one portion of the phosphor plate 150 and connects the first pad portion 164-1 to the first bonding portion 160-9, and the second connection portion 165-2 passes through another portion of the phosphor plate 150 and connects the second pad portion 164-2 to the first bonding portion 160-10.

The bonding portions (for example, 160-1 to 160-10) and the connection portions 165-1 and 165-2 serve as passages dissipating heat of the phosphor plate 150. For this reason, in the present embodiment, heat emission efficiency is improved, and discoloration and cracks of the phosphor plate 150 caused by heat can thus be prevented.

In addition, in the present embodiment, no separate pad exposure process is required and an overall process is thus simplified, since the pad portions 164-1 and 164-2 of the second electrodes 144-1 and 144-2 are disposed on the upper surface 152 of the phosphor plate 150.

Figure 10:
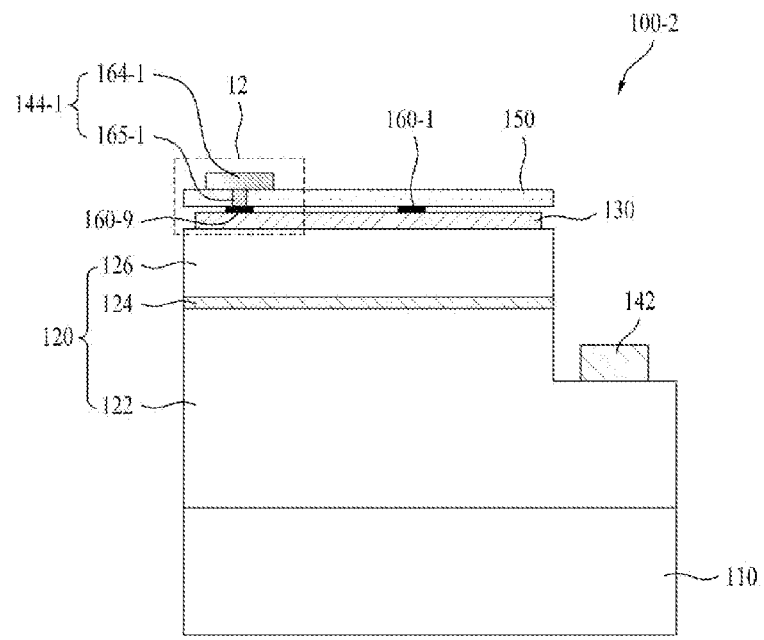
FIG. 10 is a sectional view taken along the direction AB of a varied embodiment of the light emitting device shown in FIG. 1.
Figure 11:
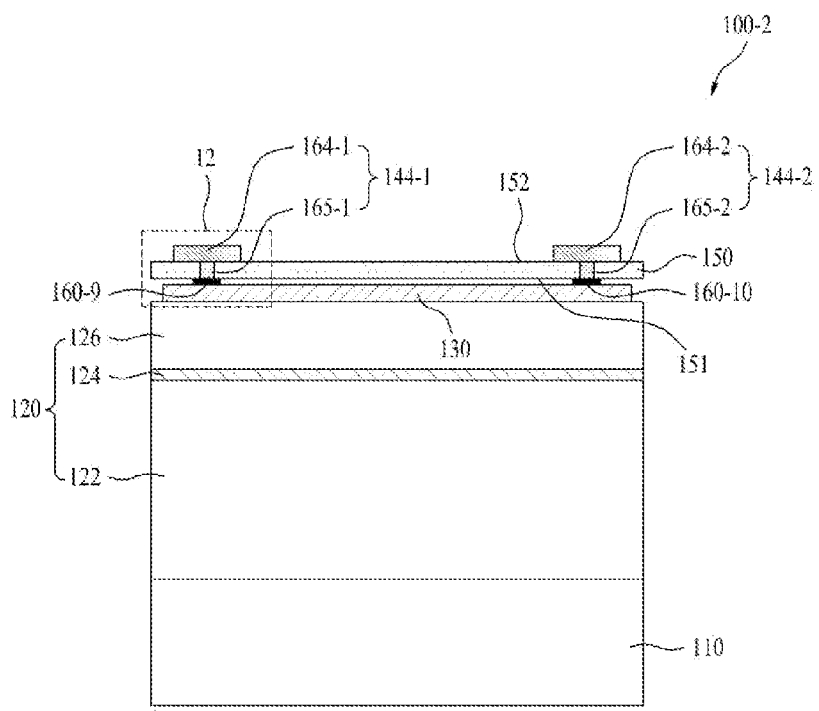
FIG. 11 is a sectional view taken along the direction CD of the varied embodiment of the light emitting device shown in FIG. 10.

FIG. 10 is a sectional view taken along the direction AB of a varied embodiment 100-2 of the light emitting device shown in FIG. 1. FIG. 11 is a sectional view taken along the direction CD of the varied embodiment of the light emitting device 100-2 shown in FIG. 10. The plan view of the light emitting device 100-2 according to the varied embodiment may be the same as in FIG. 1. Identical reference numerals represent like configurations throughout FIGS. 1 to 3 and the contents described above are omitted or described in brief.

Referring to FIGS. 10 and 11, compared with the light emitting device 100-1 shown in FIG. 1, the light emitting device 100-2 according to the varied embodiment may further include a conductive layer 130 disposed on the second semiconductor layer 126.

The conductive layer 130 reduces total reflection and exhibits light transmittance, thus increasing an extraction efficiency of light emitted from the active layer 124 to the second semiconductor layer 126.

The conductive layer 130 may be formed of a material having high electrical conductivity. The conductive layer 130 may have a single or multiple layer structure comprising at least one transparent conductive oxide of, for example, indium tin oxide (ITO), tin oxide (TO), indium zinc oxide IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The bonding portion 160-1 to 160-n (in which n is a natural number of 1 or more) of the light emitting device 100-2 according to the varied embodiment may be interposed between the phosphor plate 150 and the conductive layer 130 and adhere or fix the phosphor plate 150 to the conductive layer 130.

The first bonding portion (for example, 160-9 or 160-10) of the light emitting device 100-2 according to the varied embodiment may be disposed between the connection portion 165-1 or 165-2 and the conductive layer 130, and adhere or fix the second electrode 144 to the conductive layer 130, or connect the second electrode 144 to the conductive layer 130.

The first bonding electrode (for example, 170-9 to 170-10) and the first bonding layer (for example, 170-1 to 170-8) of the light emitting device 100-2 according to the varied embodiment may be disposed on the conductive layer 130.

Formation methods and materials of the first bonding electrodes (for example, 170-9 and 170-10), the first bonding layers (for example, 170-1 to 170-8), the second bonding electrodes 180-9 and 180-10, the second bonding layers (for example, 180-1 to 180-8), and the connection portions 165-1 and 165-2 of the light emitting device 100-2 according to the varied embodiment and a method (see FIGS. 7, 8 and 9) for forming the bonding portions 160-1 to 160-n (in which n is a natural number of 1 or more) may be the same as described above.

For these reasons, the light emitting device 100-2 according to the varied embodiment exhibits improved reliability due to resistance to high temperatures, improved adhesion accuracy of the phosphor plate 150 and simplifies an overall process due to unnecessariness of separate pad exposure process.

An air gap 163 may be present between the phosphor plate 150 and the conductive layer 130 by the bonding portion (for example, 160-1 to 160-10), as described in FIG. 8.

Although the air gap 163 is present, one portion of the lower surface 151 of the phosphor plate 150 may contact the second semiconductor layer 126. A difference in index of refraction may be present between the second semiconductor layer 126, the air gap 163, and the phosphor plate 150. For this reason, light diffusion and extraction of the light emitting device 100-2 can be improved.

Figure 12:
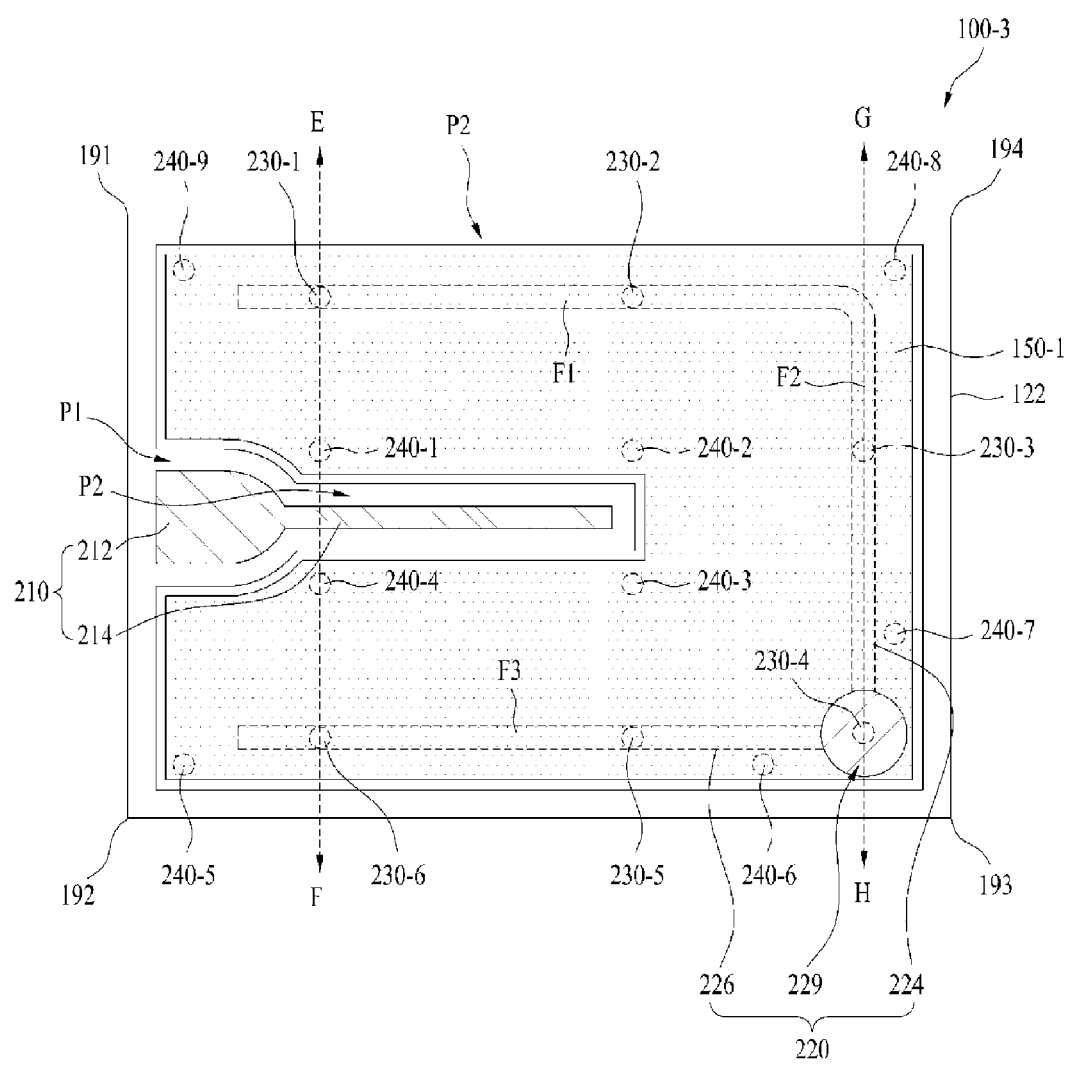
FIG. 12 is a plan view illustrating a light emitting device according to another embodiment.
Figure 13:
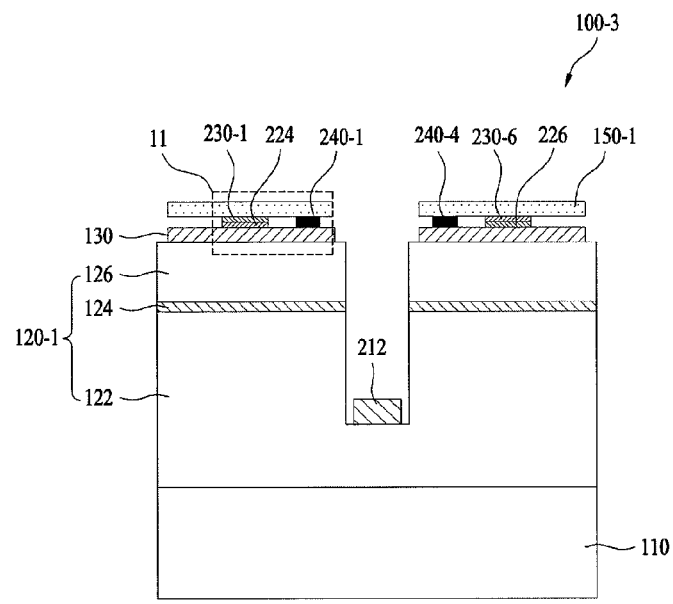
FIG. 13 is a sectional view taken along the direction EF of the light emitting device shown in FIG. 12.
Figure 14:
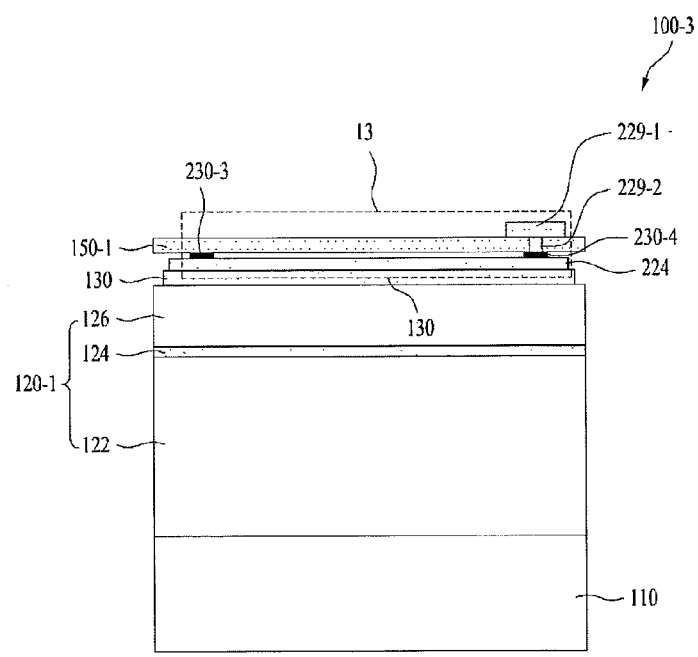
FIG. 14 is a sectional view taken along the direction GH of the light emitting device shown in FIG. 12.

FIG. 12 is a plan view illustrating a light emitting device 100-3 according to another embodiment. FIG. 13 is a sectional view taken along the direction EF of the light emitting device 100-3 shown in FIG. 12. FIG. 14 is a sectional view taken along the direction GH of the light emitting device 100-3 shown in FIG. 12. Identical reference numerals represent identical configurations throughout FIGS. 1 to 3 and the contents described above are omitted or described in brief.

Referring to FIGS. 12 and 14, the light emitting device 100-3 includes a substrate 110, a light emitting structure 120-1, a conductive layer 130, a first electrode 210, a second electrode 220, at least one first bonding portion 230-1 to 230-m (in which m is a natural number of 1 or more), at least one second bonding portion 240-1 to 240-n (in which n is a natural number of 1 or more), and a phosphor plate 150-1.

Compared with the light emitting device 100-1 according to the embodiment shown in FIG. 1, the light emitting device 100-3 is different from the light emitting device 100-1 in terms of electrode structure, the shape of the light emitting structure 120-1 and the structure of the bonding portion.

The shape of the exposed portion P1 of the first semiconductor layer 122 shown in FIG. 12 may be different from that of FIG. 1. For example, the light emitting structure 120-1 may expose the first portion P1 and the second portion P2 of the first semiconductor layer 122. The first portion P1 may be a region in which the first pad portion 212 of the first electrode 210 is disposed and the second portion P2 may be a region in which a first extension electrode 214 of the first electrode 210 is disposed.

The first electrode 210 may include the first pad portion 212 disposed in the first portion P1 of the first semiconductor layer 122 and the first extension electrode 214 disposed in the second portion P2 of the first semiconductor layer 122.

The first pad portion 212 may be a region of the first electrode 210 in which a wire is bonded to receive first power. The first extension electrode 214 is a remaining region of the first electrode 210 which branches from the first pad portion 212 and extends in a first direction. The first direction extends from a first edge 191 of the light emitting structure (for example, the first semiconductor layer 122) toward a fourth edge 194 thereof.

The embodiment shown in FIG. 12 includes one first extension electrode 214 which branches from the first pad portion 212, but the disclosure is not limited thereto and the first extension electrode 214 may include a plurality of finger electrodes.

The second electrode 220 may be disposed on the upper surface 152 of the phosphor plate 150-1 for wire bonding and include a second pad portion 119 having a part which passes through the phosphor plate 150-1 and is exposed to the lower surface 151 of the phosphor plate 150-1, and second extension electrodes 224 and 226 disposed on the conductive layer 130. In another embodiment, the conductive layer 130 may be omitted. In this case, the second extension electrodes 224 and 226 may be disposed on the second semiconductor layer 126.

The first electrode 210 and the second electrode 220 may be formed of the same material as the first and second electrodes 142 and 144 described in FIG. 1.

The first bonding portion 230-1 to 230-m (in which m is a natural number of 1 or more) bonds the phosphor plate 150-1 to the second extension electrodes 224 and 226, bonds the second pad portion 229 to the extension electrodes 224 and 226) and electrically connects the second pad portion 229 to the extension electrodes 224.

The second bonding portion 240-1 to 240-n (in which n is a natural number of 1 or more) may be disposed between the phosphor plate 150-1 and the conductive layer 130 and bond the phosphor plate 150-1 to the conductive layer 130. In another embodiment, the conductive layer 130 may be omitted. In this case, the second bonding portion 240-1 to 240-$n$ (in which n is a natural number of 1 or more) may be disposed between the phosphor plate 150-1 and the light emitting structure 120-1 and bond the phosphor plate 150-1 to the light emitting structure 120-1.

Figure 15:
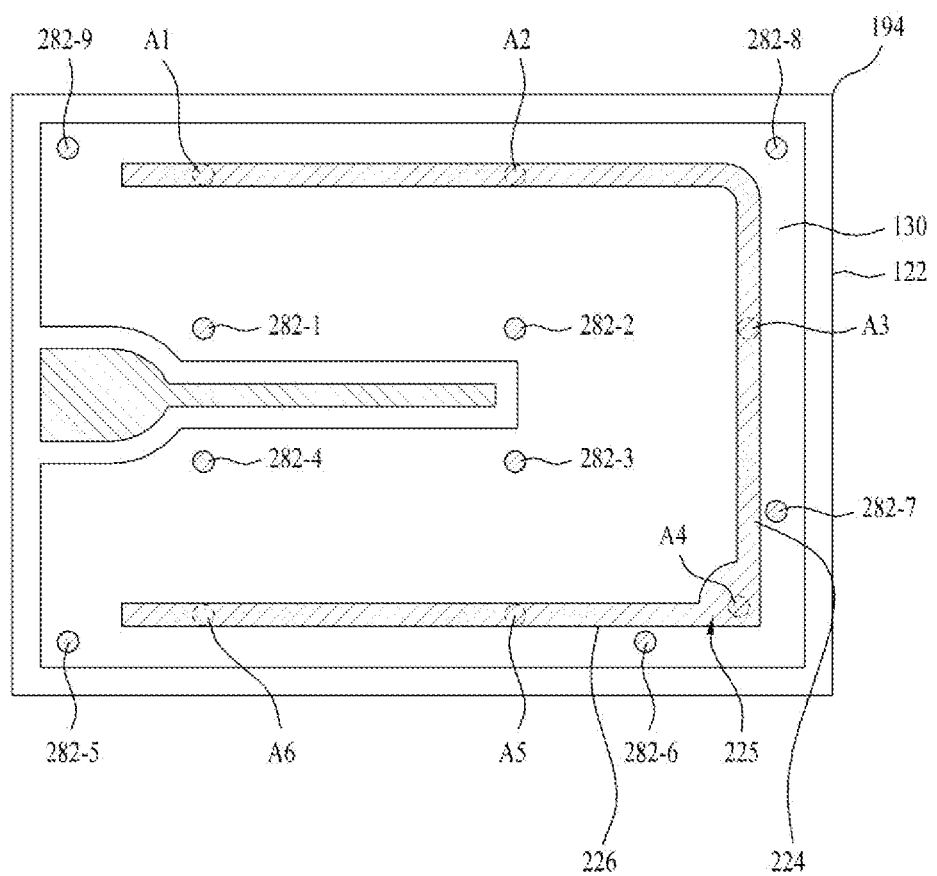
FIG. 15 illustrates a first bonding layer and a second extension electrode of a second bonding portion shown in FIG. 12.
Figure 16:
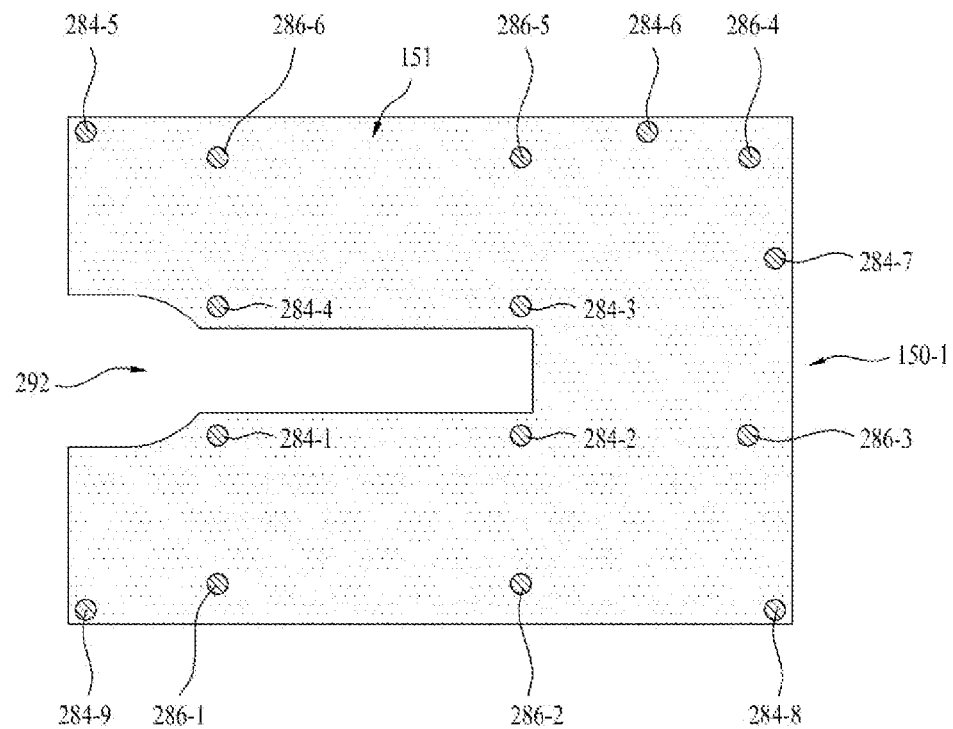
FIG. 16 illustrates a lower surface of the phosphor plate shown in FIG. 12.
Figure 17:
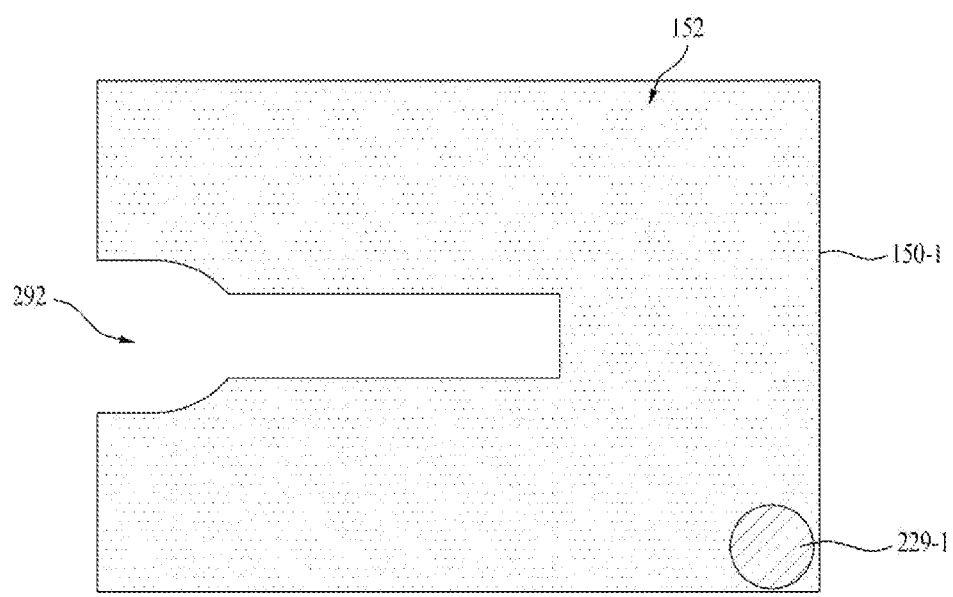
FIG. 17 illustrates an upper surface of the phosphor plate shown in FIG. 12.

FIG. 15 illustrates a first bonding layer 282-1 to 282-$n$ (in which n is a natural number of 1 or more), and second extension electrodes 224 and 226 of the second bonding portion 240-1 to 240-9 shown in FIG. 12. FIG. 16 illustrates a lower surface 151 of the phosphor plate 150-1 shown in FIG. 12. FIG. 17 illustrates an upper surface 152 of the phosphor plate 150-1 shown in FIG. 12.

Referring to FIGS. 15 to 17, the phosphor plate 150-1 may have an exposure portion 292 which corresponds to the shape of a portion of the light emitting structure 120-1 exposing the first electrode 210.

The first bonding portion 230-1 to 230-$m$ (in which m is a natural number of 1 or more) may include at least one third bonding electrode 286-1 to 286-$m$ (in which m is a natural number of 1 or more). The third bonding electrode 286-1 to 286-$m$ (in which m is a natural number of 1 or more) may be disposed on the lower surface 151 of the phosphor pate 150-1 such that it corresponds to or is arranged in the second extension electrode 224 or 226.

The third bonding electrode 286-1 to 286-$m$ (in which m is a natural number of 1 or more) may be bonded to the second extension electrode 224 or 226. As shown in FIG. 15, a portion of the second extension electrode 224 or 226, to which the third bonding electrode (286-1 to 286-$m$, in which m is a natural number of 1 or more) is bonded, is referred to as a bonding region A1 to Am (in which m is a natural number of 1 or more). The third bonding electrode (286-1 to 286-$m$, in which m is a natural number of 1 or more) may be formed of the same as the material for the second bonding electrode 180-1 to 180-$n$ (in which n is a natural number of 1 or more) described in FIG. 1.

The second bonding portion 240-1 to 240-$n$ (in which n is a natural number of 1 or more) may include at least one first bonding layer 282-1 to 282-$n$, (in which n is a natural number of 1 or more), and at least one second bonding layer 284-1 to 284-$n$ (in which n is a natural number of 1 or more) bonded to the first bonding layer 282-1 to 282-$n$ (in which n is a natural number of 1 or more).

The first bonding layer 282-1 to 282-$n$ (in which n is a natural number of 1 or more) may be disposed on the conductive layer 130, and may have the same structure, material and shape as the first bonding layer (for example, 170-1 to 170-8) described in FIG. 4.

The second bonding layer 284-1 to 284-$n$ (in which n is a natural number of 1 or more) may be disposed on the lower surface 151 of the phosphor plate 130. The second bonding layer 284-1 to 284-$n$ (in which n is a natural number of 1 or more) may have the same structure, material and shape as the second bonding layer (for example, 180-1 to 180-8) described in FIG. 5.

In addition, fusing of the first bonding layer 282-1 to 282-$n$ (in which n is a natural number of 1 or more) to the second bonding layer 284-1 to 284-$n$ (in which n is a natural number of 1 or more) is described in FIGS. 7 and 8.

Figure 18:
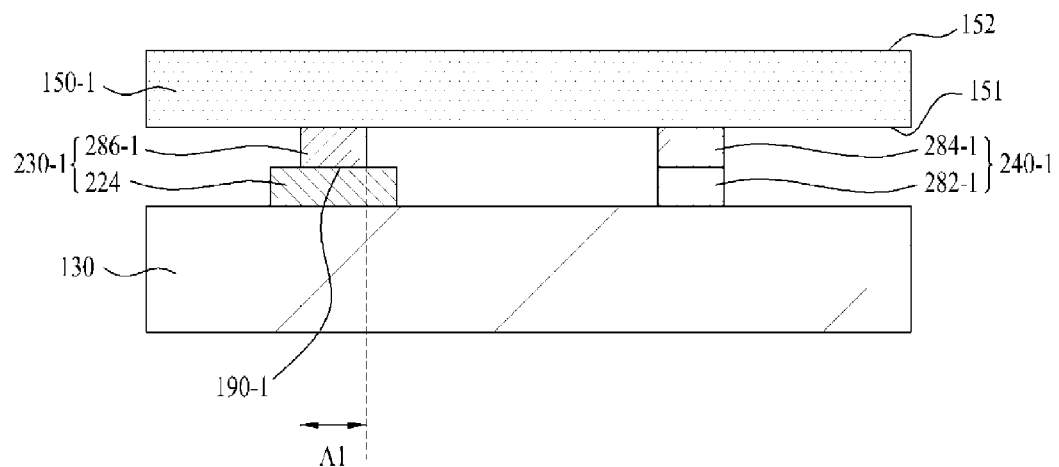
FIG. 18 is an enlarged view of a dotted line area shown in FIG. 13.

FIG. 18 is an enlarged view of a dotted line area 11 shown in FIG. 13.

Referring to FIG. 18, the third bonding electrode 286-1 to 286-$m$ (in which m is a natural number of 1 or more) is spaced from the second bonding layer 284-1 to 284-$n$ (in which n is a natural number of 1 or more), and is disposed on the lower surface 151 of the phosphor plate 130, such that it corresponds to or is arranged in the bonding region A1 to Am (in which m is a natural number of 1 or more) of the second extension electrode 224 or 226. The third bonding electrode 286-1 to 286-$m$ (in which m is a natural number of 1 or more) may be bonded to the bonding region A1 to Am (in which m is a natural number of 1 or more) of the second extension electrode 224 or 226.

The third bonding electrode 286-1 to 286-$m$ (in which m is a natural number of 1 or more) may include a plurality of third bonding electrodes and the plurality of third bonding electrodes may be spaced from one another. One (for example, 286-1) of the third bonding electrodes 286-1 to 286-$m$ (in which m is a natural number of 1 or more) may be bonded to one (for example, A1) of the corresponding bonding regions A1 to Am (in which m is a natural number of 1 or more). In this case, the third bonding electrodes 286-1 to 286-$m$ (in which m is a natural number of 1 or more) may be eutectic-bonded to the bonding regions A1 to Am (in which m is a natural number of 1 or more).

A fused interface 190-1 may be present between the third bonding electrode 286-1 to 286-$m$ (in which m is a natural number of 1 or more) and the bonding region A1 to Am (in which m is a natural number of 1 or more) of the second extension electrode 224 or 226.

A width of the third bonding electrode 286-1 to 286-$m$ (in which m is a natural number of 1 or more) may be smaller than or equivalent to that of the second extension electrode 224 or 226. This enables the third bonding electrode 286-1 to 286-$m$ (in which m is a natural number of 1 or more) to be easily bonded to the second extension electrode 224 or 226.

Also, a melting point of the third bonding electrode 286-1 to 286-$m$ (in which m is a natural number of 1 or more) may be different from that of the extension electrode 224 or 226. For example, the melting point of the third bonding electrode 286-1 to 286-$m$ (in which m is a natural number of 1 or more) may be lower than that of the second electrode 220, that is, the second extension electrode 224 or 226. This enables the third bonding electrode 286-1 to 286-$m$ (in which m is a natural number of 1 or more) to be fused to the second extension electrode 224 or 226. When melting points of the second extension electrodes 224 and 226 are low, the second extension electrodes 224 and 226 may be deformed during bonding by fusion, and current may not be smoothly supplied to the second semiconductor layer 126 or the conductive layer 130.

Figure 19:
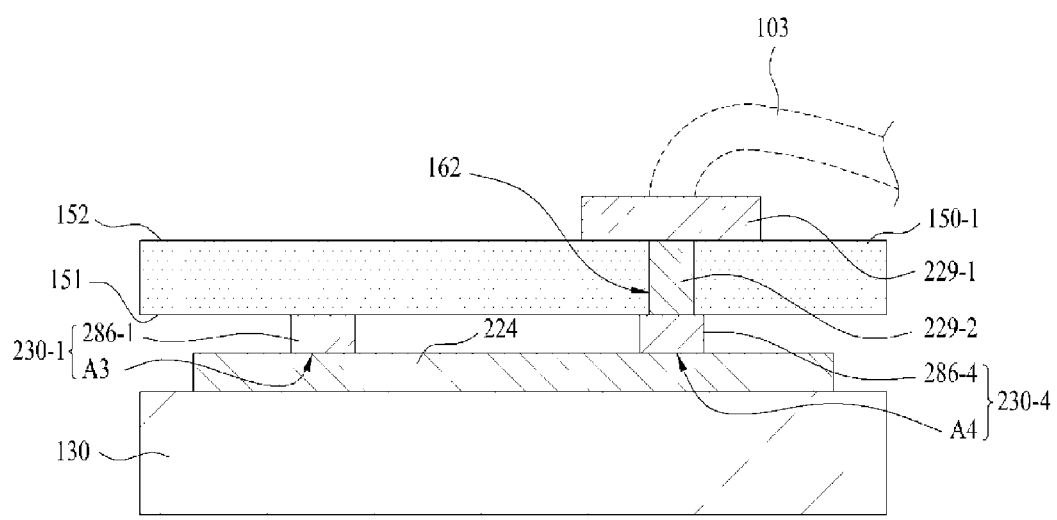
FIG. 19 is an enlarged view of a dotted line area shown in FIG. 14.

FIG. 19 is an enlarged view of a dotted line area 13 shown in FIG. 14.

Referring to FIG. 19, the second pad portion 229-1 may be disposed on the upper surface 152 of the phosphor plate 150-1 and the connection portion 229-2 may pass through the phosphor plate 150-1 and may be exposed to the lower surface 151 of the phosphor plate 150-1. The first bonding portion (for example, 230-4) bonds the exposed connection portion 229-2 to the second extension electrode 224 or 226.

The phosphor plate 150-1 may have a through hole (for example, 162) corresponding to the connection portion 229-2 and the connection portion 229-2 may be disposed in the through hole (for example, 162).

One end of the connection portion 229-2 may contact the lower surface of the second pad portion 229-1 and the other end thereof may contact the upper surface of the third bonding electrode (for example, 286-4).

The second extension electrode 224 or 226 may include a plurality of finger electrodes to distribute current. For example, the second extension electrode may include a first finger electrode 224 having a first portion F1 which extends from a bonding region A4, to which the third bonding electrode 286-4 contacting the connection portion 229-2 is bonded, in a second direction, and a second portion F2 which extends from one end of the first portion F1 to a third direction, and a second finger electrode 226 having a third portion F3 which extends from the bonding region A4 in the third direction. The second direction extends from a third edge 193 of the light emitting structure 120-1, for example, the first semiconductor layer 122 to a fourth edge 194 and the third direction may be opposite to the first direction.

FIG. 15 illustrates two finger electrodes 224 and 226 which branch from a region 225 of the second extension electrodes 224 and 226, in which the bonding region A4 electrically connected to the second pad portion 229-1 is disposed, but the disclosure is not limited thereto. In another embodiment, the number of finger electrodes 224 and 226 may be one or three or more. In addition, a width or diameter of the region of the second extension electrodes 224 and 226 in which the finger electrodes 224 and 226 join to each other may be greater than that of other region.

In FIG. 15, the first finger electrode 224 and the second finger electrode 226 are bilaterally asymmetrical, based on the region 225 of the second extension electrodes 224 and 226 in which the bonding region A4 is disposed. In another embodiment, the first finger electrode 224 and the second finger electrode 226 may be bilaterally symmetrical.

The first and second bonding portions 230-1 to 230-$m$ and 240-1 to 240-$n$ (in which n is a natural number of 1 or more), and the connection portions 165-1 and 165-2 serve as passages dissipating heat of the phosphor plate 150-1. For this reason, in the present embodiment, heat emission efficiency is improved, and discoloration and cracks of the phosphor plate 150-1 caused by heat can thus be prevented.

In addition, in the present embodiment, no separate pad exposure process is required and an overall process is thus simplified, since the pad portion 229-1 is disposed on the upper surface 152 of the phosphor plate 150-1.

Figure 20:
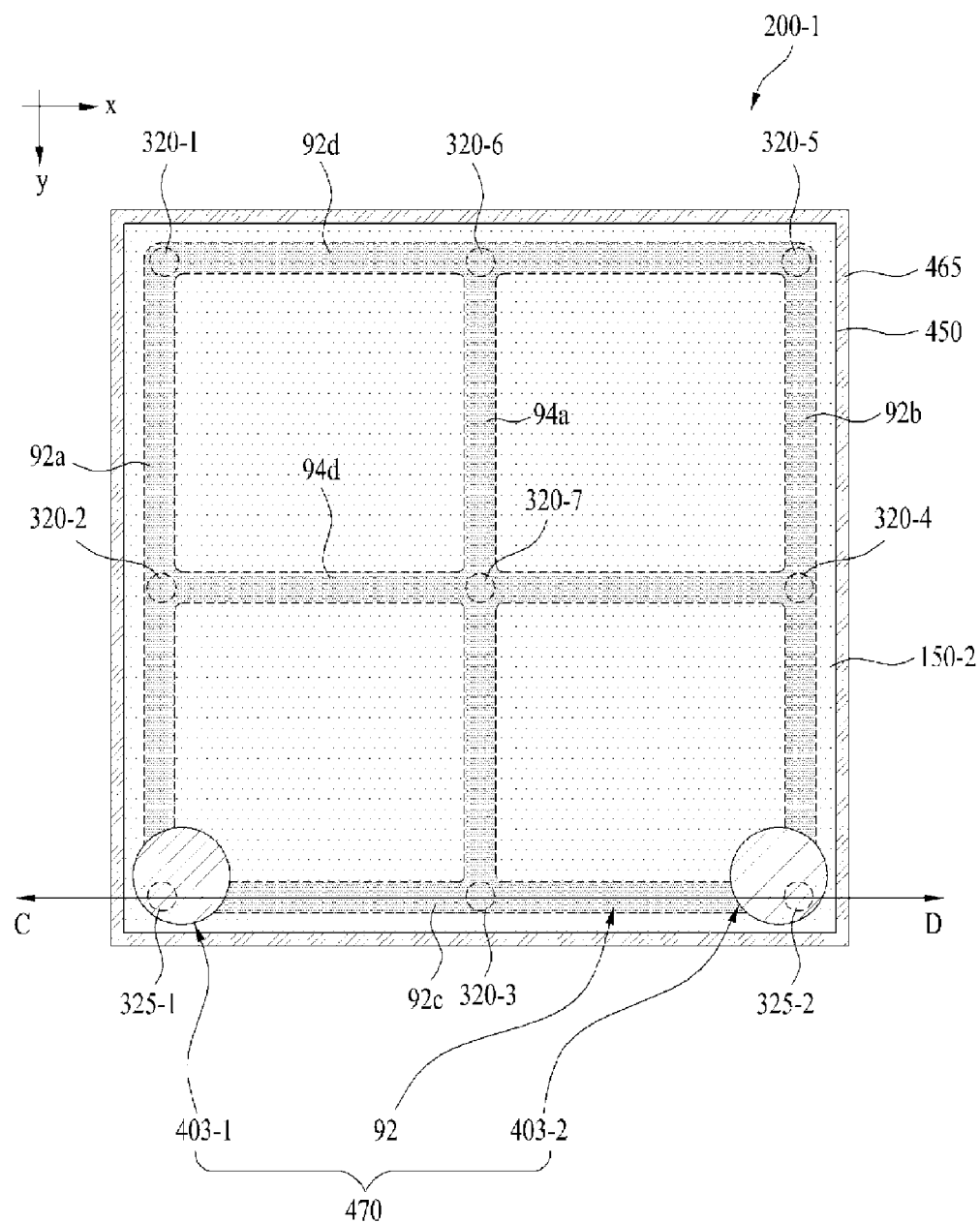
FIG. 20 is a plan view illustrating a light emitting device according to another embodiment.
Figure 21:
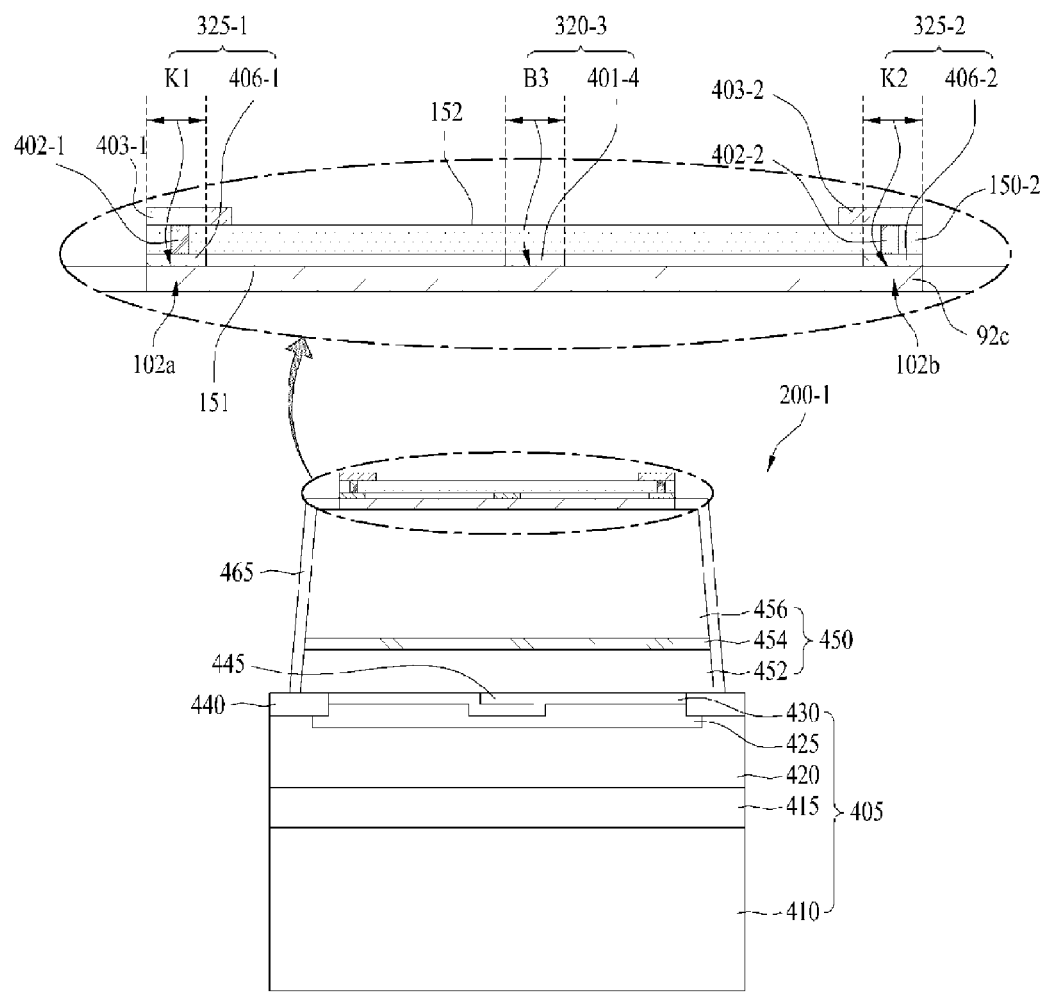
FIG. 21 is a sectional view taken along the direction AB of the light emitting device shown in FIG. 20.

FIG. 20 is a plan view illustrating a light emitting device 200-1 according to another embodiment. FIG. 21 is a sectional view taken along the direction AB of the light emitting device 200-1 shown in FIG. 20.

Referring to FIGS. 20 and 21, the light emitting device 200-1 includes a second electrode portion 405, a protective layer 440, a current blocking layer 445, a light emitting structure 450, a passivation layer 465, a first electrode portion 470, a phosphor plate 150-2 and a first bonding portion 310-1 to 310-$n$ (in which n is a natural number of 1 or more), 325-1 and 325-2.

The second electrode portion 405 supplies power to the light emitting structure 450, together with the first electrode portion 470. The second electrode portion 405 may include a support layer 410, a bonding layer 415, a barrier layer 420, a reflective layer 425, and an ohmic region 430.

The support layer 410 supports the light emitting structure 450. The support layer 410 may be formed of a metal or a semiconductor material. In addition, the support layer 410 may be formed of a material having high electrical conductivity. For example, the support layer 410 may be a metal material including at least one of copper (Cu), copper alloy (Cu alloy), gold (Au), nickel (Ni), molybdenum (Mo), and copper-tungsten (Cu—W), or a semiconductor including at least one of Si, Ge, GaAs, ZnO, and SiC.

The bonding layer 415 may be disposed between the support layer 410 and the barrier layer 420 and serve as a bonding layer to adhere the support layer 410 to the barrier layer 420. The bonding layer 415 may for example include at least one metal material of In, Sn, Ag, Nb, Pd, Ni, Au and Cu. The bonding layer 415 is formed in order to adhere the support layer 410 to the barrier layer 420 by a bonding method. When the support layer 410 is formed by plating or deposition, the bonding layer 415 may be omitted.

The barrier layer 420 is disposed under the reflective layer 425, the ohmic area 430 and the protective layer 440 and prevents metal ions of the bonding layer 415 and the support layer 410 from passing through the reflective layer 425 and the ohmic area 430, and diffusing into the light emitting structure 450. For example, the barrier layer 420 may include at least one of Ni, Pt, Ti, W, V, Fe, and Mo and may have a single or multiple layer structure.

The reflective layer 425 may be disposed on the barrier layer 420 and reflect light emitted from the light emitting structure 450 to improve light extraction efficiency. The reflective layer 425 may be formed of a light-reflective material, for example, a metal or alloy including at least one of Ag, Ni, Al, Rh, Pd, Ir, Ru, Mg, Zn, Pt, Au, and Hf.

The reflective layer 425 may have a multiple layer structure such as IZO/Ni, AZO/Ag, IZO/Ag/Ni, or AZO/Ag/Ni comprising a metal or an alloy, and a light-transmitting conductive material such as IZO, IZTO, IAZO, IGZO, IGTO, AZO and ATO.

The ohmic area 430 may be disposed between the reflective layer 425 and the second semiconductor layer 452 and ohmic-contacts the second semiconductor layer 452 to smoothly supply power to the light emitting structure 450.

The light-transmitting conductive layer and a metal may be selectively used for formation of the ohmic area 430. For example, the ohmic area 430 may include a metal material, for example, at least one of Ag, Ni, Cr, Ti, Pd, Ir, Sn, Ru, Pt, Au and Hf, which ohmic-contacts the second semiconductor layer 452.

The protective layer 440 may be disposed at an edge of the second electrode layer 405. For example, the protective layer 440 may be disposed at an edge of the ohmic area 430, an edge of the reflective layer 425, an edge of the barrier layer 420, or an edge of the support layer 410.

The protective layer 440 prevents deterioration in reliability of the light emitting device 300-2 caused by detachment of the interface between the light emitting structure 450 and the second electrode layer 405. The protective layer 440 may be formed of an electrical insulating material, for example, ZnO, $SiO_2$, $Si_3N_4$, $TiO_x$ (x represents a positive real number), or $Al_2O_3$.

The current blocking layer 445 may be disposed between the ohmic area 430 and the light emitting structure 450. An upper surface of the current blocking layer 445 contacts the second semiconductor layer 452 and a lower surface, or a lower surface and a side surface of the current blocking layer 445 may contact the ohmic area 430. At least part of the current blocking layer 445 may overlap the first electrode portion 170 in a vertical direction. The current blocking layer 445 is formed between the ohmic area 430 and the second semiconductor layer 452, or between the reflective layer 425 and the ohmic area 430, but the disclosure is not limited thereto.

The current blocking layer 445 may be a material having a lower electrical conductivity than the reflective layer 425 or the ohmic area 430, a material Schottky-contacting the second semiconductor layer 452, or an electrical insulating material. For example, the current blocking layer 445 may include at least one of ZnO, $SiO_2$, SiON, $Si_3N_4$, $Al_2O_3$, $TiO_2$ and AiN.

The light emitting structure 450 may be disposed on the ohmic area 430 and the protective layer 440. A side surface of the light emitting structure 450 may be an inclination surface during isolation etching to separate the resulting structure into unit chips.

The light emitting structure 450 may include a second semiconductor layer 452, an active layer 454 and a first semiconductor layer 456. The second semiconductor layer 452, the active layer 454 and the first semiconductor layer 456 are the same as described FIG. 1 and a detailed explanation thereof is omitted in order to avoid overlapping.

The passivation layer 465 may be disposed on a side surface of the light emitting structure 450 to electrically protect the light emitting structure 450. The passivation layer 465 may be disposed on a part of an upper surface of the first semiconductor layer 456 or an upper surface of the protective layer 440. The passivation layer 465 may be formed of an insulating material such as $SiO_2$, $SiO_x$, $SiO_xN_y$, $Si_3N_4$, or $Al_2O_3$.

The phosphor plate 150-2 may be disposed on the light emitting structure 450, for example, the first semiconductor layer 456. Aside from the shape, the phosphor plate 150-2 is the same property (such as material) as the phosphor plate 150 shown in FIG. 5.

Since the second electrode portion 405 is disposed under the light emitting structure 450 and requires no separate pad portion for the second electrode portion 405, the phosphor plate 150-2 may not have an extension portion exposing the pad portion for the second electrode portion 405.

The first electrode portion 470 may include an extension electrode 92 disposed on the first semiconductor layer 456, a pad portion (for example, 403-1 or 403-2) disposed on the upper surface 152 of the phosphor plate 150-2, and a connection portion (for example, 402-1 or 402-2) which passes through the phosphor plate 150-2 and connects the extension electrode 92 to the pad portion (for example, 403-1 or 403-2).

The pad portion (for example, 403-1 or 403-2) may be a portion of the first electrode portion 470 to which a wire is bonded. One end of the connection portion (for example, 402-1 or 402-2) may contact the lower surface of the pad portion (for example, 403-1 or 403-2) and the other end thereof may be exposed from the lower surface 151 of the phosphor plate 150-2.

A material of the first electrode portion 470 may include materials of the first electrode 142 and the second electrode 144 described in FIG. 1. For example, the first electrode portion 470 may include at least one of Pb, Sn, Au, Ge, Bi, Cd, Zn, Ag, Ni, Ti, Cu, Al, Ir, In, Mg, Pt and Pd, or an alloy containing the same.

The extension electrode 92 may have a predetermined pattern shape. The first semiconductor layer 456 may be provided on the upper surface thereof with a roughness pattern (not shown) to improve light extraction efficiency. In addition, the extension electrode 92 may be provided on the upper surface thereof with a roughness pattern (not shown) in order to improve light extraction efficiency.

For example, the extension electrode 92 may include outer electrodes 92a, 92b, 92c and 92d disposed along an edge of the upper surface of the first semiconductor layer 456 and inner electrodes 94a and 94b disposed in the outer electrodes 92a, 92b, 92c and 92d. The extension electrode 92 shown in FIG. 20 is given only as an example of the first electrode portion 470, and the shape thereof is not limited thereto and is variable. A width of one portion 102a or 102b of the extension electrode 92 bonded to the pad portion (for example, 403-1, 403-2) through the connection portion (for example, 402-1 or 402-2) may be larger than that of another portion of the extension electrode 92.

The first bonding portion 320-1 to 320-n (in which n is a natural number of 1 or more, 325-1, 325-2) may bond the phosphor plate 150-2 to the first electrode portion 470.

The first bonding portion (for example, 320-1 to 320-7) is interposed between the extension electrode 92 and the phosphor plate 150-2 and bonds the phosphor plate 150-2 to the extension electrode 92. In addition, the first bonding portion 325-1 or 325-2 bonds the connection portion (for example, 402-1 or 402-2) to the extension electrode 92.

Figure 22:
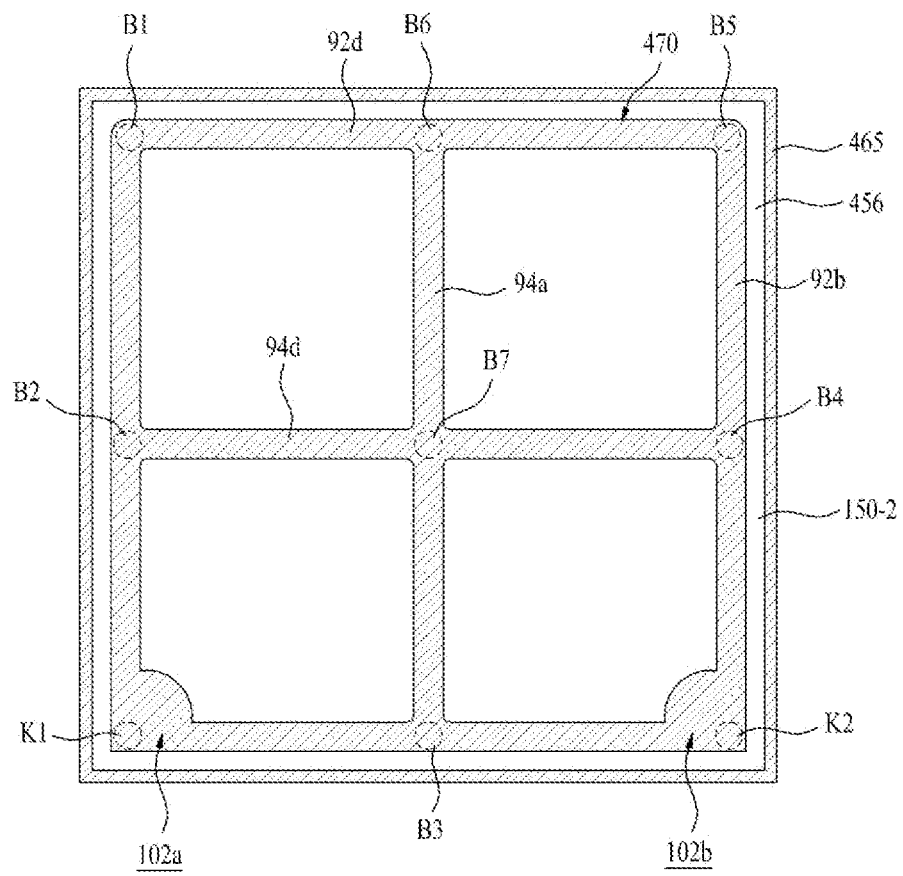
FIG. 22 illustrates a first electrode portion shown in FIG. 20.
Figure 23:
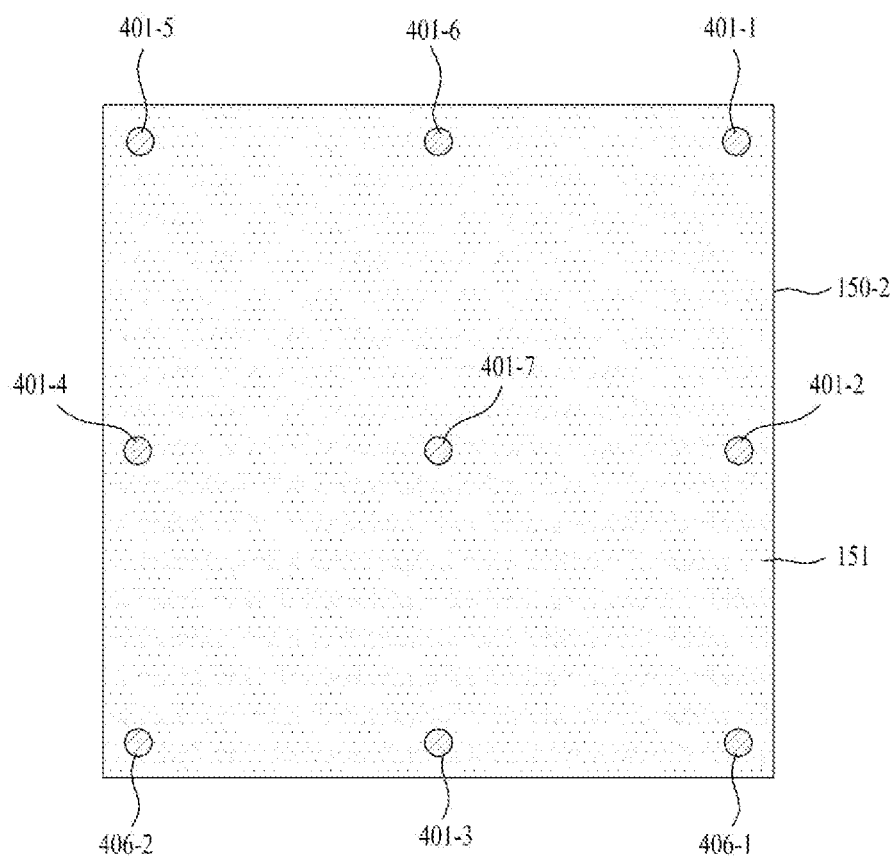
FIG. 23 illustrates a lower surface of the phosphor plate shown in FIG. 20.
Figure 24:
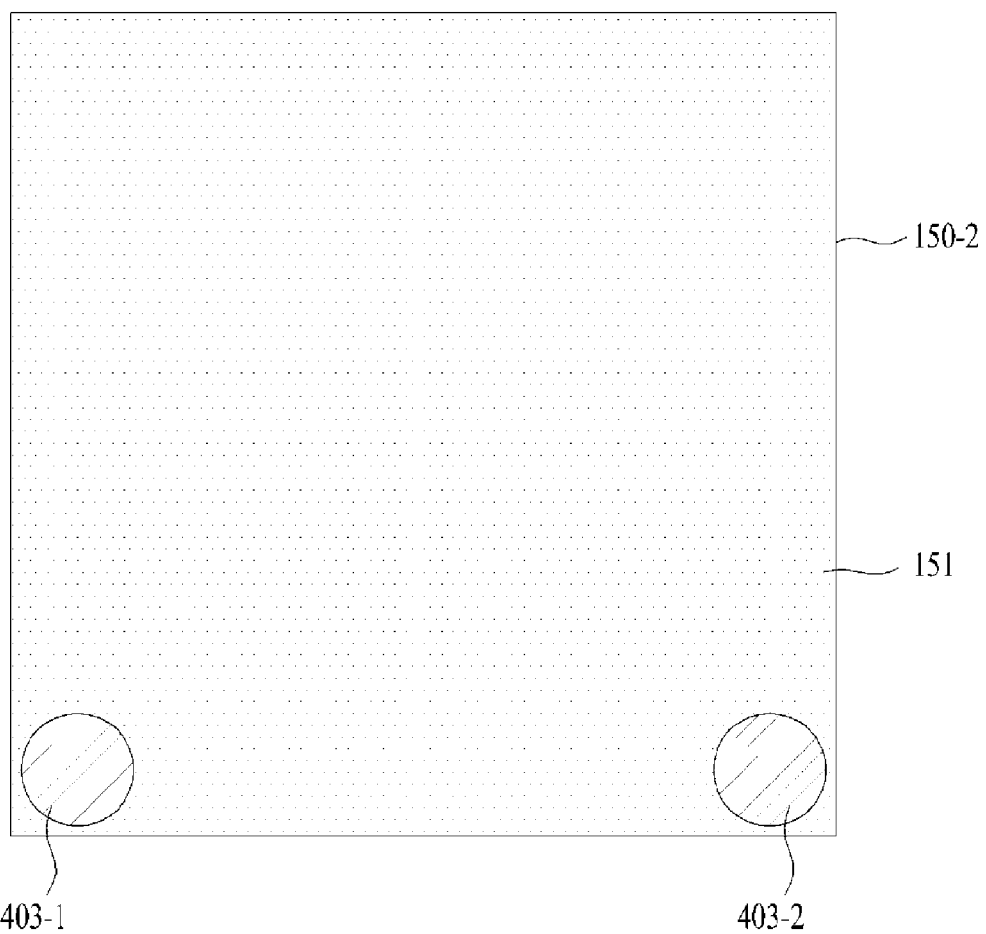
FIG. 24 illustrates an upper surface of the phosphor plate shown in FIG. 20.

FIG. 22 illustrates the first electrode portion 470 shown in FIG. 20. FIG. 23 illustrates a lower surface 151 of the phosphor plate 150-2 shown in FIG. 20. FIG. 24 illustrates an upper surface 152 of the phosphor plate 150-2 shown in FIG. 20.

Referring to FIGS. 22 to 24, the first bonding portion 320-1 to 320-n (in which n is a natural number of 1 or more) may include at least one fourth bonding electrode 401-1 to 401-n (in which n is a natural number of 1 or more) between the lower surface 151 of the phosphor plate 150-2 and the extension electrode 92.

The fourth bonding electrode 401-1 to 401-n (in which n is a natural number of 1 or more) may be the same as the third bonding electrode 286-1 to 286-m (in which m is a natural number of 1 or more) shown in FIG. 16.

The fourth bonding electrode 401-1 to 401-n (in which n is a natural number of 1 or more) may include a plurality of fourth bonding electrodes and the plurality of fourth bonding electrodes 401-1 to 401-n (n is a natural number higher than 1) may be spaced from one another on the lower surface 151 of the phosphor plate 150-2 such that they correspond to or are arranged in the extension electrode 92.

The fourth bonding electrodes 401-1 to 401-n (in which n is a natural number higher than 1) may be bonded to the extension electrode 92. A portion of the extension electrode 92, to which the fourth bonding electrodes 401-1 to 401-n (in which n is a natural number higher than 1) are bonded, is referred to as a bonding region B1 to Bn (in which n is a natural number higher than 1). A width of the fourth bonding electrode 401-1 to 401-n (in which n is a natural number higher than 1) may be smaller than or equivalent to that of the extension electrode 92.

In addition, a melting point of the fourth bonding electrode 401-1 to 401-n (in which n is a natural number higher than 1) may be different from that of the first electrode portion 470, for example, the extension electrode 92. For example, a melting point of the fourth bonding electrode 401-1 to 401-n (in which n is a natural number higher than 1) may be lower than that of the first electrode portion 470, for example, the extension electrode 92.

The fourth bonding electrode 401-1 to 401-n (in which n is a natural number higher than 1) may be fused to the extension electrode 92, and the fused interface as shown in FIG. 8 may be present between the fourth bonding electrode 401-1 to 401-n (in which n is a natural number higher than 1) and the bonding region B1 to Bn (in which n is a natural number of 1 or more) of the extension electrode 92.

The first bonding portion 325-1 or 325-2 may include the fourth bonding electrode 406-1 or 406-2 disposed between the connection portion 402-1 or 402-2 and the extension electrode 92. The number of the fourth bonding electrodes 406-1 and 406-2 may be the same as that of the pad portions 403-1 and 403-2.

The fourth bonding electrode 406-1 or 406-2 may be bonded to the extension electrode 92. Another portion of the extension electrode 92, to which the fourth bonding electrode 406-1 or 406-2 is bonded, is referred to as a bonding region K1 or K2. The fourth bonding electrode 406-1 or 406-2 may be fused to the extension electrode 92 and the fused interface as shown in FIG. 8 may be present between the fourth bonding electrode 406-1 or 406-2 and the bonding region K1 or K2 of the extension electrode 92. A width of the fourth bonding electrode 406-1 or 406-2 may be smaller than or equivalent to that of the extension electrode 92.

In addition, a melting point of the fourth bonding electrode 406-1 or 406-2 may be different from that of the first electrode portion 470, for example, the extension electrode 92. For example, a melting point of the fourth bonding electrode 406-1 or 406-2 may be lower than that of the first electrode portion 470, for example, the extension electrode 92.

An air gap 163 may be present between the phosphor plate 150 and the second semiconductor layer 126 by the first bonding portion 320-1 to 320-n (in which n is a natural number of 1 or more, 325-1, 325-2). Although the air gap 163 is present, a portion of the lower surface 151 of the phosphor plate 150-2 may contact the first semiconductor layer 456.

In the present embodiment, adhesion accuracy of phosphor plate can be improved through the first bonding portion 320-1 to 320-n, 325-1 or 325-2. The first bonding portion 320-1 to 320-n, 325-1 or 325-2, and the connection portion 402-1 or 402-2 serves as a passage dissipating heat of the phosphor plate 150-2. For this reason, in the present embodiment, heat emission efficiency is improved and discoloration and cracks of the phosphor plate 150-2 caused by heat can thus be prevented.

In addition, in the present embodiment, no separate pad exposure process is required and an overall process is thus simplified, since the pad portions 403-1 and 403-2 are disposed on the upper surface 152 of the phosphor plate 150-2.

Figure 25:
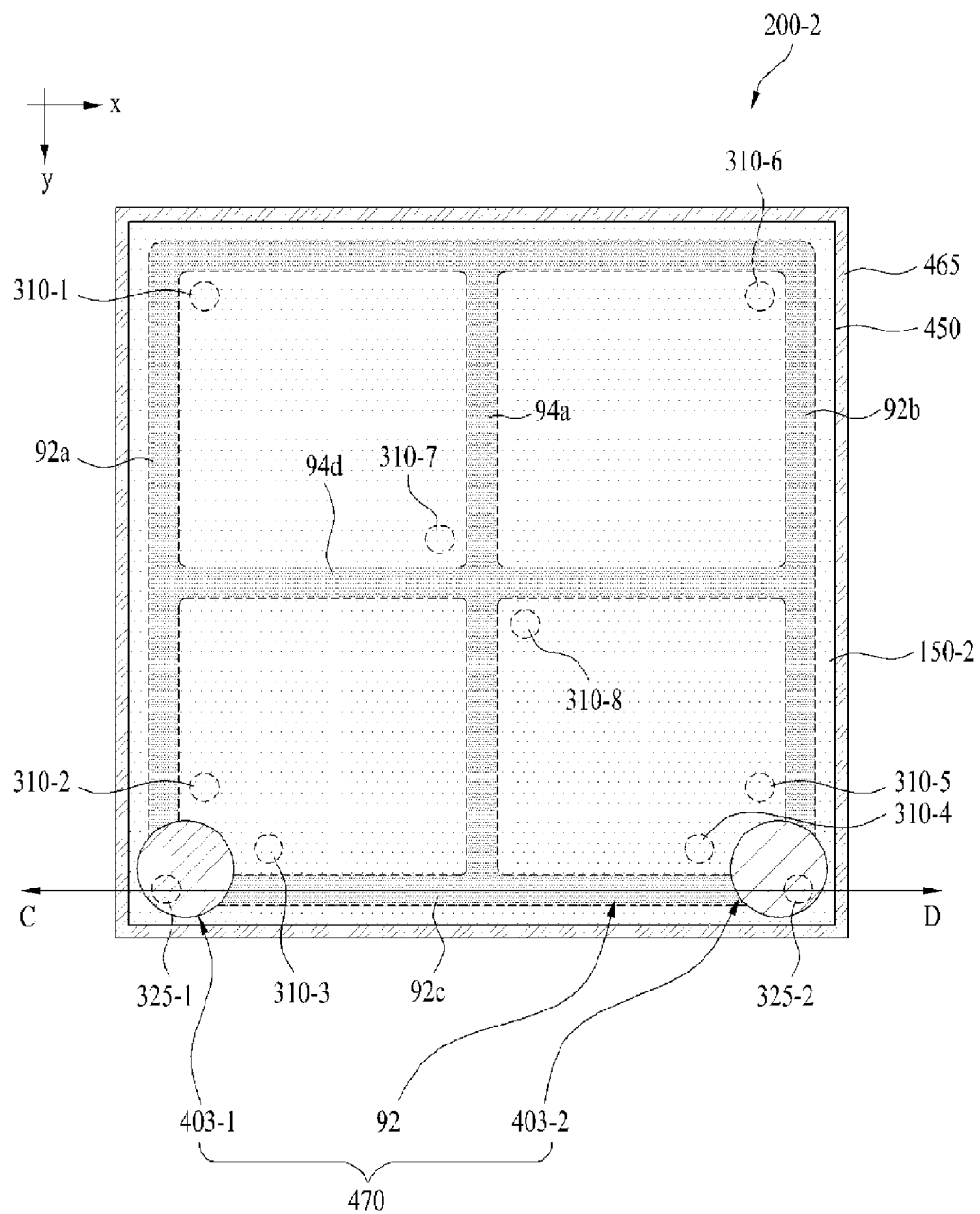
FIG. 25 illustrates a light emitting device according to a varied embodiment of the embodiment shown in FIG. 20.

FIG. 25 illustrates a light emitting device 200-2 according to a varied embodiment of the embodiment shown in FIG. 20. Referring to FIG. 25, the light emitting device 200-2 according to the varied embodiment excludes the first bonding portions 320-1 to 320-n (in which n is a natural number higher than 1) shown in FIG. 20, and includes second bonding portions 310-1 to 310-n (in which n is a natural number higher than 1) disposed between the light emitting structure 120, for example, the first semiconductor layer 456, and the lower surface 151 of the phosphor plate 150-2, and the first bonding portions 325-1 and 325-2.

The second bonding portion 310-1 to 310-n (in which n is a natural number higher than 1) adheres or fixes the phosphor plate 150-2 to the first semiconductor layer 456. The second bonding portion 310-1 to 310-n (in which n is a natural number higher than 1) may include a first bonding layer (not shown) disposed on the upper surface of the first semiconductor layer 456, and a second bonding layer (not shown) disposed on the lower surface of the phosphor plate 150-2 and bonded to the first bonding layer. For example, the structure of the second bonding portion 310-1 to 310-n (in which n is a natural number higher than 1) may be the same as that of the second bonding portion 160-1 to 160-8 shown in FIG. 1.

In addition, the light emitting device (not shown) according to another embodiment may include both the first bonding portion 320-1 to 320-n (in which n is a natural number of 1 or more) 325-1 and 325-2) shown in FIG. 20, and the second bonding portion 310-1 to 310-n (in which n is a natural number higher than 1) shown in FIG. 25.

Figure 26:
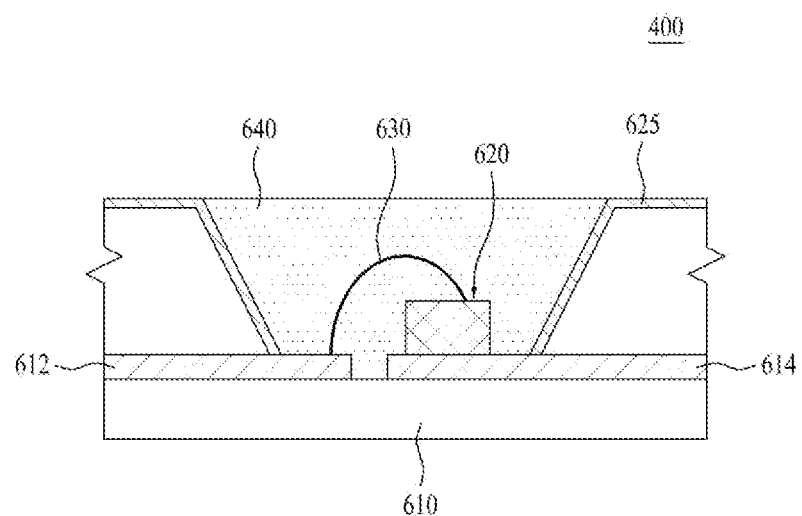
FIG. 26 illustrates a light emitting device package according to one embodiment.

FIG. 26 illustrates a light emitting device package 400 according to one embodiment.

Referring to FIG. 26, the light emitting device package 400 includes a package body 610, lead frames 612 and 614, a light emitting device 620, a reflective plate 625, a wire 630 and a resin layer 640.

The package body 610 may be provided at an upper surface thereof with a cavity. A side wall of the cavity may be inclined. The package body 610 shown in FIG. 26 has a cavity, but the disclosure is not limited thereto. In another embodiment, the package body may not have a cavity.

The package body 610 has a structure with a cavity at one side region thereof. Here, the side wall of the cavity may be inclined. The package body 610 may be formed of a substrate having excellent insulation and thermal conductivity, such as a silicon-based wafer level package, a silicon substrate, silicon carbide (SiC), aluminum nitride (AlN) or the like, and may have a structure in which a plurality of substrates are stacked. The disclosure is not limited to the above-described material, structure and shape of the package body 610.

The lead frames 612 and 614 are disposed on the surface of the package body 610 so as to be electrically separated from each other in consideration of heat discharge or mounting of the light emitting device 620.

The light emitting device 620 may be electrically connected to the lead frames 612 and 614. Here, the light emitting device 620 may be one of the light emitting devices according to the embodiments 100-1, 100-2, 200-1 and 200-2.

The reflective plate 625 may be formed on the side wall of the cavity of the package body 610 to guide light emitted from the light emitting device 620 in a designated direction. The reflective plate 625 may be formed of a light reflective material, for example, a metal coating or metal flakes.

The resin layer 640 surrounds the light emitting device 620 located within the cavity of the package body 610 to protect the light emitting device 620 from an external environment. The resin layer 640 may be formed of a colorless transparent polymer resin material, such as epoxy or silicone.

Since the light emitting device 620 according to the embodiment includes phosphor plates 150, and 150-1 to 150-3, the resin layer 640 may not include a phosphor. However, in another embodiment, the resin layer 640 may include phosphors which are the same as or differ from phosphors contained in the phosphor plate.

Figure 27:
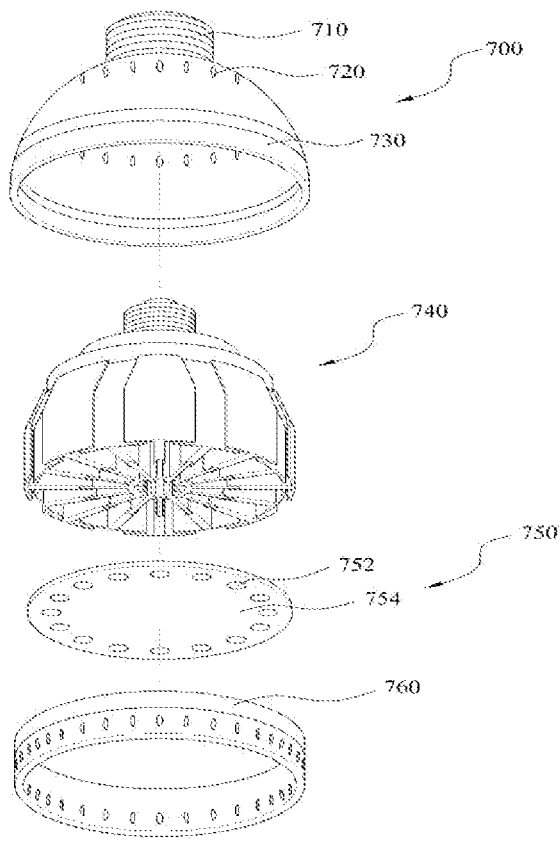
FIG. 27 is an exploded perspective view illustrating a lighting device including the light emitting device package according to one embodiment.

FIG. 27 is an exploded perspective view illustrating a lighting device including the light emitting device package according to one embodiment. Referring to FIG. 27, the lighting device includes a light source 750, a radiator 740 to emit heat of the light source 750, a housing 700 including the light source 750 and the radiator 740, and a holder 760 to connect the light source 750 and the radiator 740 to the housing 700.

The housing 700 includes a socket connector 710 bonded to an electric socket (not shown) and a body member 730 connected to the socket connector 710 wherein the body member 730 includes a light source 750. The body member 730 may be provided with an air passage hole 720.

The body member 730 of the housing 700 is provided on the surface thereof with a plurality of air passage holes 720. The number of air passage holes 720 may be one or more. The passage holes 720 may be radially arranged on the body member 730 or have other arrangements.

The light source 750 includes a substrate 754 and a plurality of the light emitting device packages 752 arranged thereon. The substrate 754 has a shape which may be inserted into an exposure portion of the housing 700 and is made of a material having high thermal conductivity to transfer heat to the radiator 740. For example, the light emitting device package 752 is the light emitting device package 400 according to the embodiment shown in FIG. 26.

The holder 760 may be provided under the light source and include a frame and another air passage hole. In addition, although not shown, optical members are provided under the light source 750 to diffuse, scatter or converge light projected by the light emitting device package 150 of the light source 750.

Figure 28:
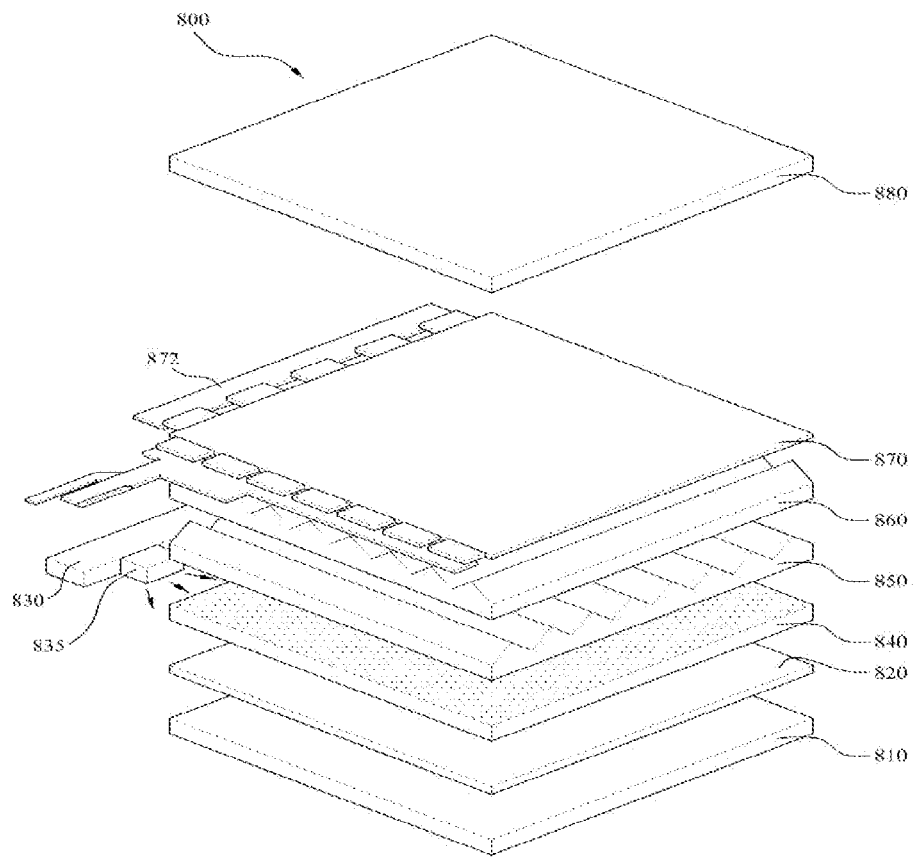
FIG. 28 is a view illustrating a display device including the light emitting device package according to one embodiment.

FIG. 28 is a view illustrating a display device including the light emitting device package according to one embodiment. Referring to FIG. 28, the display device 800 according to this embodiment includes a bottom cover 810, a reflective plate 820 disposed on the bottom cover 810, light emitting modules 830 and 835 to emit light, a light guide plate 840 arranged in front of the reflective plate 820 to direct light emitted from the light emitting module toward the front of the display device, an optical sheet including prism sheets 850 and 860 arranged in front of the light guide plate 840, a display panel 870 arranged in front of the optical sheet, an image signal output circuit being connected to the display panel 870 and supplying an image signal to the display panel 870, and a color filter 880 arranged in front of the display panel 870. The bottom cover 810, the reflective plate 820, the light emitting modules 830 and 835, the light guide plate 840 and the optical sheet may constitute a backlight unit.

The light emitting module includes light emitting device packages 835 mounted on the circuit substrate 830. The circuit substrate 830 may be a PCB or the like and the light emitting device package 835 is the same as the light emitting device package according to the embodiment illustrated in FIG. 26.

The bottom cover 810 may accommodate constituent components of the display device 800. The reflective plate 820 may be provided as a separate element, as illustrated in the drawing, or may be coated with a material having a high reflectivity provided on the back surface of the light guide plate 840 or the front surface of the bottom cover 810.

Here, the reflective plate 820 may be made of a highly reflective material capable of functioning in an ultra-thin film form and examples thereof include polyethylene terephthalate (PET).

In addition, the light guide plate 840 may be formed of polymethylmethacrylate (PMMA), polycarbonate (PC) or polyethylene (PE).

The first prism sheet 850 is formed at a side of the support film using a light-transmitting and elastic polymer and the polymer may include a prism layer having a plurality of repeatedly formed three-dimensional structures. Here, the plurality of patterns, as illustrated in the drawing, may be provided as stripe patterns in which protrusions and grooves repeatedly alternate.

A direction of the protrusions and grooves arranged on one side of the support film in the second prism sheet 860 may be vertical to a direction of the protrusions and grooves arranged on one side of the support film in the first prism sheet 850 so that light transferred from the light emitting module and the reflective plate can be uniformly distributed in all directions of the display panel 870.

Although not shown, a diffusion sheet may be disposed between the light guide plate 840 and the first prism sheet 850. The diffusion sheet may be made of a polyester or polycarbonate material and maximizes a projection angle of light incident from the backlight unit through refraction and scattering. Also, the diffusion sheet includes a support layer containing a light diffuser, and a first layer and a second layer which are formed on a light emission surface (first prism sheet direction) and a light incident surface (reflection sheet direction) and do not contain a light diffuser.

In this embodiment, the first prism sheet 850 and the second prism sheet 860 constitute an optical sheet and the optical sheet may be for example provided as a micro lens array, a combination of one or more diffusion sheets and a micro lens array, or a combination of one prism sheet and a micro lens array.

The display panel 870 may be a liquid crystal panel and other display devices requiring a light source may be arranged, in addition to the liquid crystal panel 860.

Figure 29:
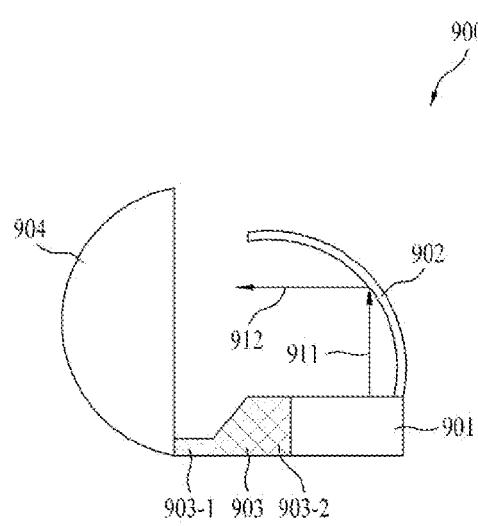
FIG. 29 illustrates a head lamp including the light emitting device package according to one embodiment.

FIG. 29 illustrates a head lamp 900 including the light emitting device package according to one embodiment. Referring to FIG. 29, the head lamp 900 includes a light emitting module 901, a reflector 902, a shade 903 and a lens 904.

The light emitting module 901 may include a light emitting device package 400 according to one embodiment disposed a substrate (not shown). The reflector 902 may reflect light 911 irradiated from the light emitting module 901 in a predetermined direction, for example, a front direction 912.

The shade 903 is a member which is disposed between the reflector 902 and the lens 904 and blocks or reflects a part of light which is reflected from the reflector 902 and directs toward the lens 904 to form a light distribution pattern satisfying a designer's intention. A height of one side 903-1 of the shade 903 may be different from that of other side 903-2 thereof.

The light irradiated from the light emitting module 901 is reflected on the reflector 902 and the shade 903, passes through the lens 904 and extends toward the front of a body. The lens 904 refracts light reflected by the reflector 902 in the front direction.

As is apparent from the above description, the embodiments provide a light emitting device to improve adhesion accuracy of phosphor plates and prevent discoloration and cracks of the phosphor plates caused by heat.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure comprising a first semiconductor layer, an active layer and a second semiconductor layer;
   a pad disposed on the second semiconductor layer;
   an extension electrode extending from the pad and disposed on the second semiconductor layer;
   a phosphor plate disposed on the second semiconductor layer;
   a first electrode disposed on the phosphor plate;
   at least one first bonding portion disposed between a portion of the first electrode passing through the phosphor plate and the second semiconductor layer; and at least one second bonding portion disposed between a lower surface of the phosphor plate and an upper surface of the extension electrode,
wherein the at least one first bonding portion contacts the portion of the first electrode passing through the phosphor plate, and
wherein an upper surface of the at least one second bonding portion contacts only the lower surface of the phosphor plate and is spaced from the first electrode.

2. The light emitting device according to claim 1, wherein the first electrode comprises:
a pad portion disposed on an upper surface of the phosphor plate; and
a connection portion passing through the phosphor plate and connecting the pad portion to the first bonding portion, and
wherein the at least one second bonding portion is spaced from the connection portion.

3. The light emitting device according to claim 2, wherein the second bonding portion comprises:
a first bonding layer disposed on the lower surface of the phosphor plate; and
a second bonding layer disposed on the light emitting structure and bonded to the first bonding layer.

4. The light emitting device according to claim 2, wherein the first bonding portion comprises:
a first bonding electrode disposed on the second semiconductor layer; and
a second bonding electrode disposed on the lower surface of the phosphor plate and on the connection portion, and bonded to the first bonding electrode.

5. The light emitting device according to claim 4, wherein the second bonding electrode is fused to the first bonding electrode.

6. The light emitting device according to claim 5, wherein a fused interface is present between the first bonding electrode and the second bonding electrode.

7. The light emitting device according to claim 4, wherein a melting point of the second bonding electrode is different from a melting point of the first bonding electrode.

8. The light emitting device according to claim 2, wherein the first electrode further comprises an extension electrode disposed on the second semiconductor layer, and
wherein the first bonding portion comprises a third bonding electrode disposed between the connection portion and the extension electrode, and bonds the connection portion to the extension electrode.

9. The light emitting device according to claim 8, wherein a melting point of the third bonding electrode is different from a melting point of the extension electrode.

10. The light emitting device according to claim 9, wherein the third bonding electrode is fused to the extension electrode.

11. The light emitting device according to claim 10, wherein a fused interface is present between the third bonding electrode and the extension electrode.

12. The light emitting device according to claim 8, wherein a width of one portion of the extension electrode bonded to the third bonding electrode is different from a width of another portion of the extension electrode.

13. The light emitting device according to claim 8, wherein a width of the third bonding electrode is smaller than or equivalent to width of the extension electrode.

14. The light emitting device according to claim 1, wherein an air void (gap) is present between the phosphor plate and the light emitting structure.

15. The light emitting device according to claim 2, wherein the first electrode further comprises an extension electrode disposed on the second semiconductor layer,
wherein the first bonding portion comprises a third bonding electrode being disposed between a lower surface of the phosphor plate and the extension electrode and bonding the phosphor plate to the extension electrode, and
wherein the third bonding electrode is arranged in the extension electrode.

16. The light emitting device according to claim 15, wherein the first bonding portion further comprises a bonding electrode being disposed between the connection portion and the extension electrode and bonding the connection portion to the extension electrode.

17. The light emitting device according to claim 4, wherein the first bonding electrode and the second bonding electrode comprise at least one identical metal.

18. The light emitting device according to claim 2, wherein the pad portion is disposed at a side of the phosphor plate.

19. A light emitting device package comprising:
a package body;
a first lead frame and a second lead frame disposed on the package body;
a light emitting device disposed on the second lead frame; and
a resin layer surrounding the light emitting device,
wherein the light emitting device comprises:
a light emitting structure comprising a first semiconductor layer, an active layer and a second semiconductor layer;
a pad disposed on the second semiconductor layer;
an extension electrode extending from the pad and disposed on the second semiconductor layer;
a phosphor plate disposed on the second semiconductor layer;
a first electrode disposed on the phosphor plate;
at least one first bonding portion disposed between a portion of the first electrode passing through the phosphor plate and the second semiconductor layer; and
at least one second bonding portion disposed between a lower surface of the phosphor plate and an upper surface of the extension electrode,
wherein the at least one first bonding portion contacts the portion of the first electrode passing through the phosphor plate, and
wherein an upper surface of the at least one second bonding portion contacts only the lower surface of the phosphor plate and is spaced from the first electrode.

* * * * *